United States Patent
Lee et al.

(10) Patent No.: US 9,839,133 B2
(45) Date of Patent: Dec. 5, 2017

(54) LOW-AREA OVERHEAD CONNECTIVITY SOLUTIONS TO SIP MODULE

(71) Applicant: APPLE INC., Cupertino, CA (US)

(72) Inventors: Meng Chi Lee, Los Altos, CA (US); Shankar Pennathur, San Jose, CA (US); Scott L. Gooch, Cupertino, CA (US); Dennis R. Pyper, San Jose, CA (US); Amir Salehi, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/730,250

(22) Filed: Jun. 4, 2015

(65) Prior Publication Data

US 2016/0021756 A1    Jan. 21, 2016

Related U.S. Application Data

(63) Continuation-in-part of application No. 14/296,449, filed on Jun. 4, 2014.

(51) Int. Cl.
*H01L 23/40* (2006.01)
*H05K 1/18* (2006.01)
(Continued)

(52) U.S. Cl.
CPC ........ *H05K 1/189* (2013.01); *H01L 23/4012* (2013.01); *H01L 25/0652* (2013.01); *H01L 25/0655* (2013.01); *H05K 1/141* (2013.01); *H05K 1/144* (2013.01); *H05K 1/181* (2013.01); *H05K 3/4015* (2013.01); *H05K 3/284* (2013.01);
(Continued)

(58) Field of Classification Search
CPC ............. H01L 23/4012; H01L 25/0652; H01L 25/0655; H01L 25/0657; H01L 25/071; H01L 25/0756
See application file for complete search history.

(56) References Cited

U.S. PATENT DOCUMENTS

| 4,768,286 A | 9/1988 | Ketcham |
| 5,054,193 A | 10/1991 | Ohms |

(Continued)

FOREIGN PATENT DOCUMENTS

| JP | 2011514015 | 4/2011 |
| KR | 1020090022749 | 3/2009 |

(Continued)

OTHER PUBLICATIONS

International Search Report and Written Opinion of the International Searching Authority dated Sep. 15, 2015 for International Application No. PCT/US2015/034233, 13 pages.
(Continued)

*Primary Examiner* — Phat X Cao
(74) *Attorney, Agent, or Firm* — Kilpatrick Townsend & Stockton, LLP

(57) ABSTRACT

Readily modifiable and customizable, low-area overhead interconnect structures for forming connections between a system-in-a-package module and other components in an electronic device. One example may provide an interposer for providing an interconnection between a system-in-a-package module and other components in an electronic device. Another may provide a plurality of conductive pins or contacts to form interconnect paths between a module and other components.

18 Claims, 28 Drawing Sheets

(51) Int. Cl.
*H05K 1/14* (2006.01)
*H01L 25/065* (2006.01)
*H05K 3/40* (2006.01)
*H05K 3/36* (2006.01)
*H05K 3/28* (2006.01)

(52) U.S. Cl.
CPC ... *H05K 3/361* (2013.01); *H05K 2201/10318* (2013.01); *H05K 2201/10378* (2013.01); *H05K 2203/1316* (2013.01); *Y10T 29/49128* (2015.01)

(56) References Cited

U.S. PATENT DOCUMENTS

| | | | |
|---|---|---|---|
| 5,296,739 | A | 3/1994 | Heilbronner |
| 6,335,492 | B1 | 1/2002 | Terasaka |
| 6,686,649 | B1 | 2/2004 | Mathews |
| 6,818,821 | B2 | 11/2004 | Fujieda |
| 7,881,068 | B2 | 2/2011 | Vatanparast |
| 8,008,753 | B1 | 8/2011 | Bolognia |
| 8,294,252 | B1 | 10/2012 | Patel |
| 2002/0027010 | A1 | 3/2002 | Glenn |
| 2003/0165051 | A1 | 9/2003 | Kledzik et al. |
| 2006/0115928 | A1 | 6/2006 | Nguyen et al. |
| 2006/0163707 | A1* | 7/2006 | Hooi ............... H01L 23/16 257/678 |
| 2006/0272857 | A1 | 12/2006 | Arnold |
| 2011/0228506 | A1 | 9/2011 | Chen |
| 2011/0286194 | A1 | 11/2011 | Kawabata |
| 2012/0061814 | A1 | 3/2012 | Camacho et al. |
| 2012/0217624 | A1 | 8/2012 | Morris et al. |
| 2013/0223038 | A1 | 8/2013 | Yamamoto et al. |
| 2013/0241044 | A1* | 9/2013 | Kim ............... H01L 23/36 257/698 |
| 2013/0343023 | A1 | 12/2013 | Nakagoshi et al. |
| 2014/0103527 | A1* | 4/2014 | Marimuthu ...... H01L 23/3121 257/737 |
| 2014/0203457 | A1 | 7/2014 | Kim et al. |
| 2015/0187742 | A1 | 7/2015 | Kwon et al. |
| 2015/0200182 | A1 | 7/2015 | Wang et al. |
| 2015/0200185 | A1 | 7/2015 | Yu et al. |
| 2015/0206854 | A1 | 7/2015 | Lane et al. |
| 2015/0359099 | A1 | 12/2015 | Pennathur et al. |

FOREIGN PATENT DOCUMENTS

| | | |
|---|---|---|
| WO | 2013/095402 A1 | 6/2013 |
| WO | 2013/176426 A1 | 11/2013 |

OTHER PUBLICATIONS

Non-Final Office Action dated Aug. 14, 2015 for U.S. Appl. No. 14/296,449, 13 pages.
Non-Final Office Action dated Feb. 4, 2016 for U.S. Appl. No. 14/296,449, 13 pages.
Advisory Action, U.S. Appl. No. 14/296,449, dated May 18, 2016, 4 pages.
Non-Final Office Action, U.S. Appl. No. 14/296,449, dated Jun. 24, 2016, 13 pages.
Restriction Requirement, U.S. Appl. No. 14/296,449, dated Apr. 23, 2015, 8 pages.
Notice of Decision to Grant, China Patent Application No. 201520379217.8, dated Nov. 19, 2015, 2 pages.
Office Action, China Patent Application No. 201520379217.8, dated Aug. 7, 2015, 4 pages.
Office Action, Korea Patent Application No. 10-2016-0037062, dated May 10, 2016, 13 pages.
Invitation to Pay Additional Fees and Partial Search Report, International Patent Application No. PCT/US2016/024110, dated Jun. 29, 2016, 6 pages.
Office Action, Taiwan Patent Application No. 104208922, dated Jan. 15, 2016, 3 pages.
Office Action, Taiwan Patent Application No. 105203852, dated May 12, 2016, 2 pages.
International Search Report and Written Opinion dated Oct. 5, 2016 in PCT/US2016/024110, 17 pages.
Notice of Allowance dated Oct. 6, 2017 in U.S. Appl. No. 15/041,033, 12 pages.

* cited by examiner

LOW-AREA OVERHEAD CONNECTIVITY SOLUTIONS TO SIP MODULE

CROSS-REFERENCES TO RELATED APPLICATIONS

This application is a continuation-in-part of U.S. patent application Ser. No. 14/296,449, filed Jun. 4, 2014, which is incorporated by reference.

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, storage devices, portable media players, navigation systems, monitors, and others, have become ubiquitous.

The functionality of these devices has likewise greatly increased. This in turn has led to increased complexity inside of these electronic devices. At the same time, the dimensions of these devices have become smaller. For example, smaller and thinner devices are becoming more popular.

This increasing functionality and decreasing size have necessitated the use of space-efficient circuit techniques. As one example, system-in-a-package modules and other similar structures may be used to increase an electronic device's functionality while reducing space consumed in the device.

These system-in-a-package modules may be connected to other boards, circuits or modules in an electronic device using connector systems. But connector systems may consume considerable board space on a module. They may also have a considerable height that may match or exceed a height of the module itself. Even direct connections, for example between a flexible circuit board and system-in-a-package module, may consume a large board area.

Moreover, connector systems may be difficult to modify when a design change to a module is necessary. Also, it may be difficult to acquire a customized connector system for a specific use. They may also be provided by third parties separate from a company that may manufacture the system-in-a-package modules and electronic devices. This separation may lead to further complications when a modified or custom connector system is desired.

Thus, what is needed are easily modifiable and customizable, low-area overhead interconnect structures for forming connections between a system-in-a-package module and other boards, circuits, or components in an electronic device.

SUMMARY

Accordingly, embodiments of the present invention may provide readily modifiable and customizable, low-area overhead interconnect structures for forming connections between a system-in-a-package module and other boards, circuits, or components in an electronic device.

An illustrative embodiment of the present invention may provide an interposer for providing an interconnection between a first board and a second board. The first board may support or be part of a system-in-a-package module and the second board may provide an interconnect paths to other circuits or components in an electronic device. The interposer may include first contacts on a bottom surface and second contacts on a top surface. Interposer interconnect paths may be formed between the first contacts and the second contacts. The first contacts may be coupled to traces on a first board, the first board supporting a system-in-a-package module. Circuits and other components in the module may be coupled to the traces on the first board. Contacts on the second board may be coupled to the second contacts on the top of the interposer. Traces coupled to the contacts on the second board may couple to other boards, circuits, or components in an electronic device.

The interposer may be formed of various materials. For example, the interposer may be a printed circuit board formed of FR-4, BT, or other high-density substrate. The interposer may alternatively be formed of plastic or other material. The interconnect paths may be formed using traces on layers in the printed circuit board joined together with vias between layers of the board.

In this and other examples, the first board may be a printed circuit board, flexible circuit board, or other appropriate substrate. The second board may be a flexible circuit board, printed circuit board, or other appropriate substrate.

This interposer may provide a highly modifiable interconnect structure. Specifically, contact placement and the interconnect paths between the contacts may be readily modified using conventional printed circuit techniques. This interposer may also provide a highly customizability since its size, shape, and contact configurations may be readily arranged using these same conventional techniques. This may provide a high-degree of flexibility and configurability, in particular when compared to a convention connector system.

These interposers may also provide low-area overhead interconnect structures. Specifically, these interposers may be placed adjacent to a system-in-a-package module or other structure. Contacts on a bottom side of the interposer may be coupled to contacts on a first board supporting the module. The interposer may be adjacent to the module and the contacts may be very close to the module, thereby reducing the board space used. Contacts on a top side of the interposer may couple to traces in a second board, where the top of the interposer is at least approximately in a line with a top of the module. This configuration may eliminate or at least reduce the need for providing clearance or space between the second board and the module, again saving space.

In various embodiments of the present invention, the first contacts on a bottom of the interposer may be formed using ball grid array type contacts or similar structure. This may allow the interposer to be attached to the first board, such as a printed circuit board, at the same time as other surface-mounted devices and circuits. That is, the use of these or similar contacts may allow an interposer to be treated as another surface mount device during a wave soldering or other attachment process. The second contacts on a top side of the interposer may be attached to a second board, such as a flexible circuit board, using surface mount techniques, hot-bar soldering, anisotropic conductive film, or other attachment methods.

Various embodiments of the present invention may facilitate the connection of the second board to the interposer in different ways. In one specific embodiment of the present invention, the second board may overlap the interposer to cover at least a portion of the module. This may provide a larger area for forming a connection, which may be particularly useful when hot-bar soldering or similar attachment techniques are used.

In still other embodiments of the present invention, an interposer may be notched or stepped such that a top surface of the interposer is larger than a bottom surface of the interposer. This larger top surface may help to facilitate a connection of a second board to the top of the interposer. For example, contact size may be increased on the top surface. Also, additional contacts, for example additional ground or power contacts, may be placed on the top side to provide additional shielding or isolation.

In one embodiment of the present invention, an interposer may be notched or stepped such that the remaining module portion itself is stepped. This stepped portion of the module may result in a portion of the module having a lower height. In various embodiments of the present invention, appropriately sized components may be placed in this shallow or lower-height region in order to more fully utilize module space. In another embodiment of the present invention, an interposer may be notched or stepped such that a portion of the interposer resides over a top of the module. Again, this may provide a surface that may be easier to connect to a second board.

In still other embodiments of the present invention, the second board may be formed as part of the interposer. For example, a flexible board may be formed as one or more layers inside and extending from an interposer.

An illustrative embodiment of the present invention may provide an electronic device. The electronic device may include a first board, the first board having a number of interconnect traces. The first board may be a printed circuit board, flexible circuit board, or other type of board or appropriate substrate. A number of surface mount or other types of devices may be attached to a top surface of the first board. The surface mount devices may be electrically connected to traces on or in the first board. These surface mount devices may include active and passive components, integrated circuits, or other circuits or components. An interposer may be attached to the top surface of the first board. The interposer may be attached to the first board in the same or in a different manner as other surface mount devices. The interposer may be attached to the first board at the same or different time as the other surface mount devices. The interposer may have first contacts on a bottom surface electrically connected to traces in or on the first board. The interposer may further have a plurality of interconnect paths from the first contacts on the bottom surface to second contacts on a top surface. The interposer may be a multi-layer printed circuit board and the interposer interconnect paths may include contacts or traces on one or more layers and vias between at least two layers. A simple interposer may have contacts on a top and bottom side that are connected using vertical vias. A second board having a number of traces or interconnect paths may be electrically connected to the second contacts on the top surface of the interposer. That is, contacts on the second board may connect to traces on and in the second board and to the second contacts on a top surface of the interposer. The second board may be a flexible circuit board, printed circuit board, or other appropriate board or substrate.

Again, the interposer may provide interconnection pathways to a system-in-a-package module. In this case, a molded portion made of plastic or other material may be formed over the surface mount devices on the top surface of the first board and along a side of the interposer. In other embodiments of the present invention, the first board is not part of a system-in-a-package module and the molded portion may not be present. In such a case, the interposer may be used to connect two conventional boards or one or more types. Also, while surface mount devices and interposers may be used, in other embodiments of the present invention, other types of devices and interposers may be used, for example through-hole devices and interposers may be used.

Another illustrative embodiment of the present invention may provide a method of manufacturing a portion of an electronic device. This method may include forming a first board comprising a number of traces. A number of surface mount or other types of devices may be attached to a top surface of the first board. The surface mount devices may be electrically connected to traces in the number of traces. An interposer may be attached to the top surface of the first board. The interposer may have first contacts on a bottom surface electrically connected to traces on the first board. The interposer may have a plurality of interconnect paths from the first contacts on the bottom surface to second contacts on a top surface. As before, the interposer may be a multi-layer printed circuit board and the interposer interconnects paths may include contacts or traces on at least one layer and vias between at least two layers. A molding made of plastic or other material may be formed over the surface mount devices and along a side of the interposer, though such molding may be absent in other embodiments of the present invention. A second board may have a number of traces such that the traces are electrically connected to the second contacts on the top surface of the interposer. Again, the first board may be a printed circuit board and the second board may be a flexible circuit board.

Other embodiments of the present invention may provide other interconnect structures for forming electrical paths between a system-in-a-package module and other circuits or components in an electronic device. In one example, a number of pins may be used. These pins may be formed in a localized area or array, or they may be distributed among other circuits or components. These pins may be surface mounted to a top of a first board along with a number of other surface mount circuits and components. The pins, circuits, and components may be encapsulated or covered with molded plastic or other material. The molding may be lapped back, etched, or otherwise reduced as needed such that tops of the pins are exposed. The pins may then be attached to a second board, such as a flexible circuit board, using surface mount techniques, hot-bar soldering, anisotropic conductive film, or other attachment methods. In various embodiments of the present invention, not all pins may be connected to the second board. For example, some pins may be provided at the surface of the molded plastic for test, programming, or diagnostic purposes.

Another illustrative embodiment of the present invention may provide still other interconnect structures for forming electrical paths between a system-in-a-package module and other circuits or components in an electronic device. In one example, a number of contacts may be included. These contacts may be soldered or otherwise connected to pads or contacts formed on a top surface of a printed circuit board or other appropriate substrate. To facilitate soldering, a carrier formed of plastic or other nonconductive material may be used to hold the contacts in place relative to each other. This carrier may be removed or left in place after the contacts have been soldered down. In other examples, a metallic carrier formed as part of the contacts may be used, and may be broken away or otherwise removed after the contacts have been attached. In still other embodiments of the present invention, no carrier is used, or a carrier is used for only some contacts. The contacts may each then be at least partially encapsulated or covered with molded plastic or other material along with other pins, circuits or components on the board. The molding may be etched or removed, for example with a laser, to expose at least an inside surface of the contacts. In still other embodiments the present invention, a blocking or other structure may be placed against an inside surface of the contacts before the molding is formed. The blocking or other structure may be removed after the molding is formed to expose at least the inside surface of the contacts. In still other embodiments of the present invention, the contacts may have the height that exceeds the depth of the molding. In this way, a top portion of each of the plurality of contacts may be exposed. An interconnect structure, which may be a second board, may include contacts on its underside. These contacts may be arranged to mate with the contacts with contacts on a top of a printed circuit board or other appropriate substrate.

These contacts may have different configurations in various embodiments of the present invention. For example, where a typical connector may include two rows having equal numbers of contacts, embodiments of the present invention may arrange contacts in any pattern and having any the number of contacts as needed for a specific application. That is, the shapes formed by the arrangement of contacts may not be orthogonal or symmetrical and to the extent that rows are used, each row does not need to have the same number of contacts. Again, one or more carriers may be used to keep these contacts in place relative to each other until the contacts are soldered to a top surface of a printed circuit board. Following that attachment, the carriers may be removed or left in place. In still other embodiments of the present invention, the contacts may be placed individually or otherwise without a carrier. After the contacts are soldered down and the carriers are removed as needed, an overmold or molding may be formed over the circuits and components and at least a portion of each of the plurality of contacts. This overmold may be etched, lasered, machined, or otherwise removed as necessary to expose at least a portion of each of a plurality of contacts so that electrical connections to the contacts may be made. Locking or alignment features may be formed during the original overmold step or as part of this etching removal process.

In various embodiments of the present invention, these interposers, pin arrays, and contacts may be placed in various locations on a system-in-a-package module. For example, an interposer, pin array, or contacts may be placed along a side of the module. In other embodiments of the present invention, the interposer, pin array, or contacts may be placed in a corner, in middle, or other location on a module.

It should be noted that while the interconnect structures described above are well-suited to forming interconnect paths for system-in-a-package modules, in other embodiments of the present invention, other types of boards may be connected using these techniques. For example, other printed circuit boards that are not part of a system-in-a-package module may be electrically connected using these same or similar techniques and structures. For example, printed circuit boards may be attached to other boards, including printed circuit boards or flexible circuit boards, using the interposers and pins shown herein.

In various embodiments of the present invention, contacts, interconnect paths, and other conductive portions of interposers, contacts, and pins and other structures shown here may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide interconnect structures that may be located in and may connect to various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. In various embodiments of the present invention, these interconnect paths provided by these interposers and pins may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
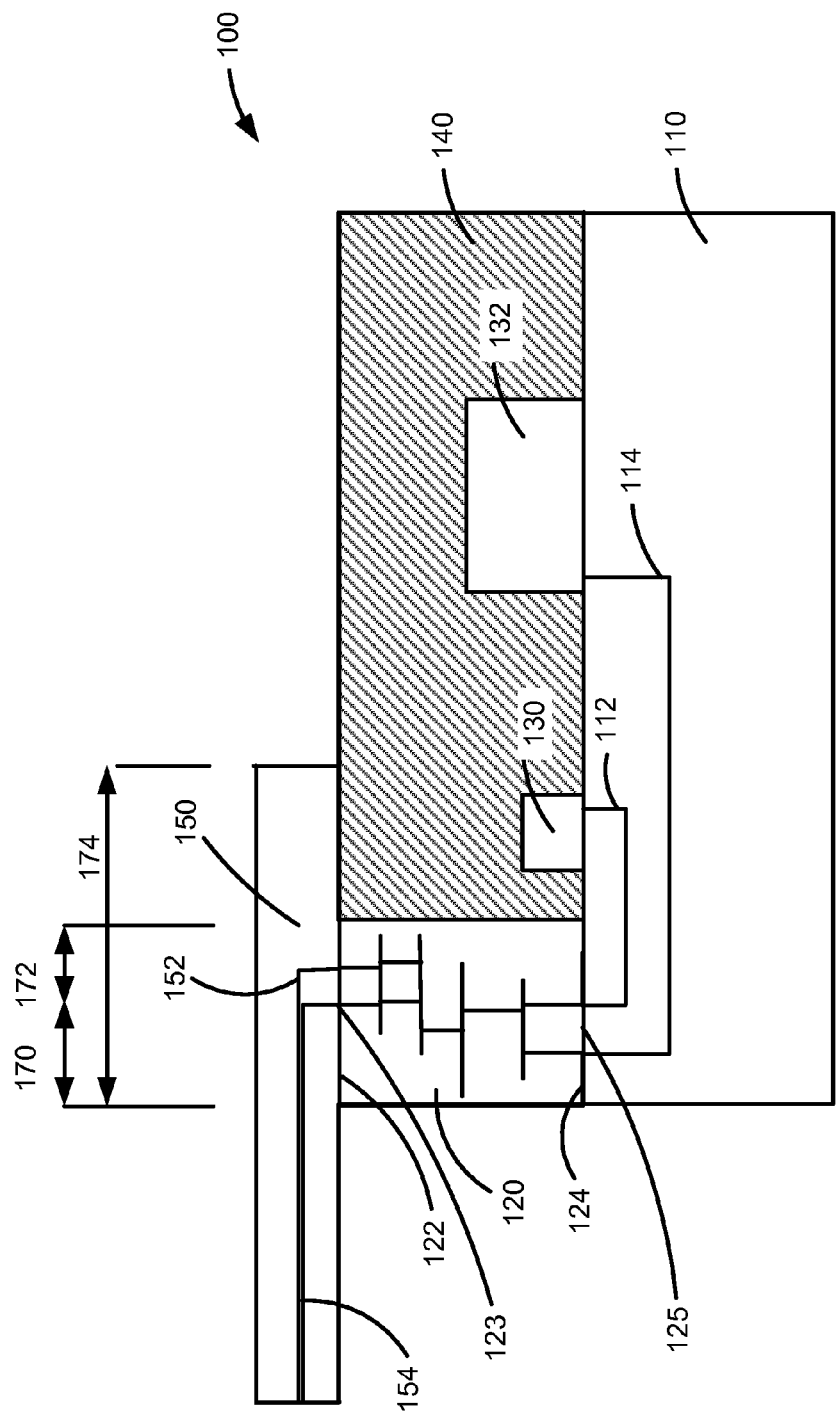
FIG. 1 illustrates a portion of an electronic device according to an embodiment of the present invention.

FIG. 1 illustrates a portion of an electronic device according to an embodiment of the present invention. This figure, as with the other included figures, is shown for illustrative purposes and does not limit either the possible embodiments of the present invention or the claims. This figure illustrates portion 100 of an electronic device including interposer 120 that may provide interconnect paths between first board 110 and second board 150.

First board 110 may include traces or other interconnect paths, represented here by traces 112 and 114. First board 110 may be a printed circuit board, flexible circuit board, or other appropriate substrate. For example, first board 110 may be a multi-layer printed circuit board. Electronic devices, circuits, or components 130 and 132 may be mounted on a top surface of board 110. Electronic devices, circuits, or components 130 and 132 may be surface mount components, though in this and the other examples they may be other types of devices, such as through-hole components. Devices, circuits, or components 130 and 132 may be active or passive components, integrated circuits, or other components or devices. Traces 112 and 114 may be electrically connected to devices, circuits, or components 130 and 132.

Interposer 120 may be attached to a top surface of board 110 at the same time as devices, circuits, or components 130 and 132, or interposer 120 may be attached to a top surface of board 110 at a different time. In various embodiments of the present invention, interposer 120 may be arranged such that it may be handled as a surface mount device. For example, contacts 125 on a bottom surface 124 of interposer 120 may be formed as a ball grid array to facilitate the handling of interposer 120 as a surface mount device. Contacts 125 on bottom surface 124 of interposer 120 may electrically connect to traces on the first board, such as traces 112 and 114. Interposer 120 may provide interconnect paths from first contacts 125 on bottom side 124 of the interposer 120 to second contacts 123 on a top side 125. Interposer 120 may include one or more layers. The interposer may include interconnect paths that may be formed of contacts or traces along surfaces of the layers and the traces may be coupled together by vias between the layers.

A molding or plastic encapsulation 124 may be formed around devices, circuits, or components 130 and 132 and a long one or more edges of interposer 120, though in other embodiments of the present invention, such molding may be absent. A top surface of the encapsulation 140 may be approximately aligned with the top surface 122 of interposer 120.

A second board 150 may be attached to the top surface 122 of interposer 120. Contacts 130 may be electrically connected to traces 152 and 154 on or in second board 150. Second board 150 may be a flexible circuit board, printed circuit board, or other appropriate board or substrate. Second board 150 may provide an interconnect path to other circuits or components in or associated with the electronic device.

Interposer 120 may provide a highly configurable interconnect structure. Specifically, contacts 125 and 122 and interconnect traces connecting them may be moved or changed using conventional printed circuit board manufacturing techniques.

Interposer 120 may also provide a highly space efficient interconnect structure. For example, flexible circuit board or second board 150 may otherwise be attached directly to a surface of first board 110. However, manufacturing tolerances may require a space between second board 150 and the encapsulation 140. In this example, this space is shown as distance 172. Given this distance, only length 170 of the first board 110 would remain for forming an attachment between second board 150 and first board 110. This limited space may make such an attachment difficult, for example where a hot-bar soldering processes is used.

Accordingly, embodiments of the present invention may provide interposer 120 and may further allow second board 150 to at least be aligned with a vertical edge, or overlap at least a portion of encapsulation 140. This provides a length 174 over which second board 150 may be attached to interposer 120. With length 174, a connection using a process such as a hot-bar process may be more readily completed. Again, in other embodiments of the present invention, other process steps, such as surface mount techniques, anisotropic conductive film, or other attachment methods or structures may be used.

In this and other embodiments of the present invention, contacts 124 may be formed using a ball grid array or other techniques. These techniques may be well-suited to providing a high density of contacts. This high density may be difficult to replicate in connecting a top surface 122 of interposer 120 to a second board 150. Accordingly, interposer 120 may be notched or stepped such that interposer 120 has a top surface 122 that is larger than a bottom surface 124. An example is shown in the following figure.

Figure 2:
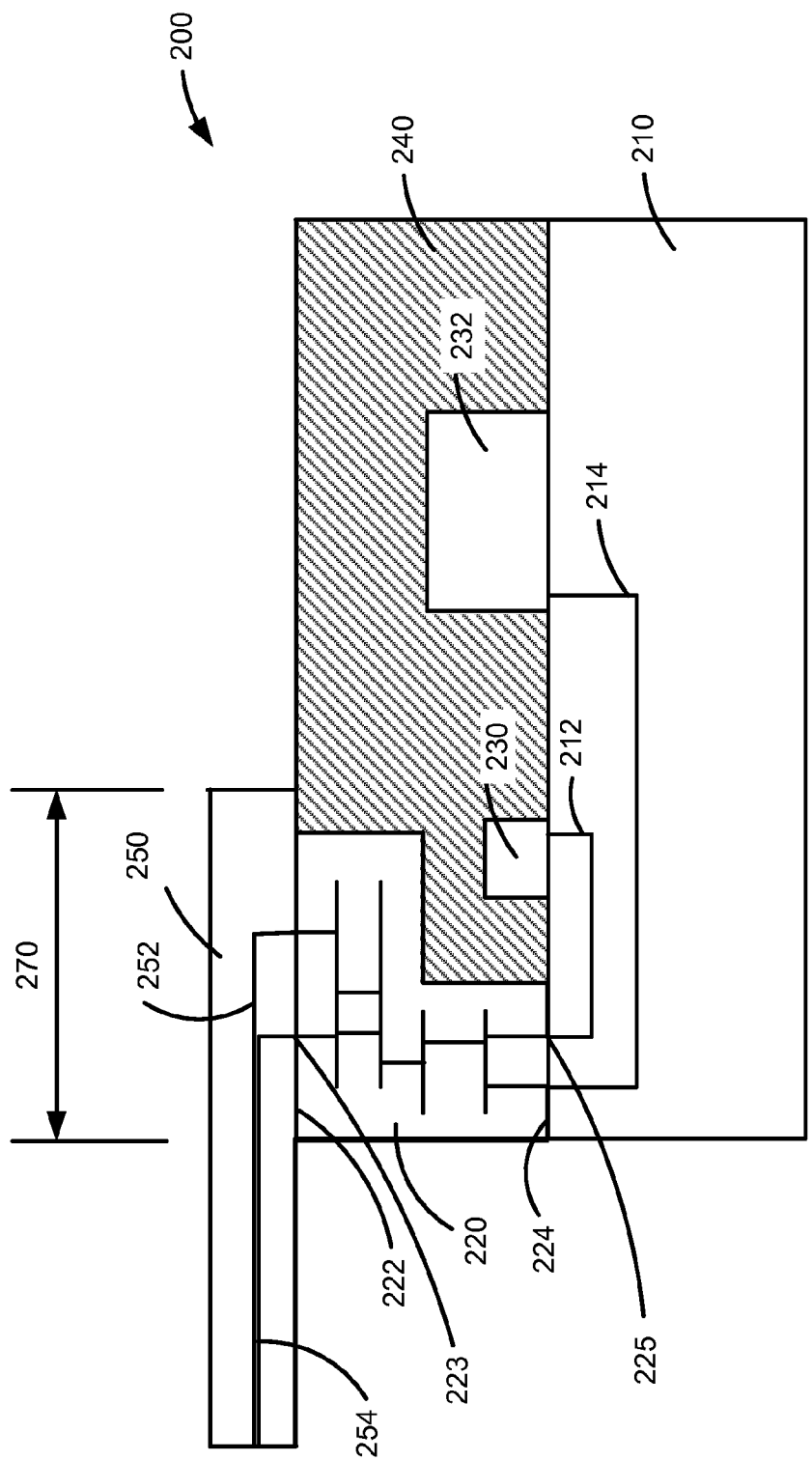
FIG. 2 illustrates a portion of an electronic device according to an embodiment of the present invention.

FIG. 2 illustrates a portion of an electronic device according to an embodiment of the present invention. As before, first board 210 may include traces 212 and 214. Traces 212 and 214 may electrically connect to devices, circuits, or components 230 and 232, which may be surface mounted on a top side of first board 210.

Interposer 220 may have a bottom surface 224 attached to a top surface of first board 210. Contacts 225 on a bottom surface 224 of interposer 220 may electrically connect to traces 212 and 214. Interposer 220 may be formed of one or more layers. Interposer 220 may include conductive paths between contacts 225 on a bottom surface 224 to contacts 223 on a top surface 222. These interconnect paths may include contacts or traces along one or more layers of interposer 220. These contacts or traces may be interconnected by vertical vias between the layers.

Devices, circuits, or components 230 and 232 may be encapsulated in a plastic molding 240 that may be defined along at least a portion of one edge by interposer 220, though again molding 240 may be absent in various embodiments of the present invention. Interposer 220 may be stepped such that top surface 222 may be larger than bottom surface 224. This step may provide a portion of encapsulation 240 having a lower height. Properly sized devices, circuits, or components, shown here as 230, may be placed in this shallow or lower-height area in order to more fully utilize space on a board 210.

Contacts 223 at top surface 222 of interposer 220 may electrically connect to traces 252 and 254 in second board 250. As before, first board 210 may be a printed circuit board, flexible circuit board, or other appropriate substrate, while second board 250 may be a flexible circuit board, printed circuit board, or other appropriate board. Second board 250 may be connected to other circuits or components in or associated with the electronic device.

As before, this embodiment of the present invention may provide a larger area that may simplify an attachment of a second board 250 to interposer 220. In this example, second board 250 may overlap at least a portion of encapsulation 240, such that length 270 is available for a hot bar during a hot-bar attachment of second board 250 to interposer 220.

Figure 3:
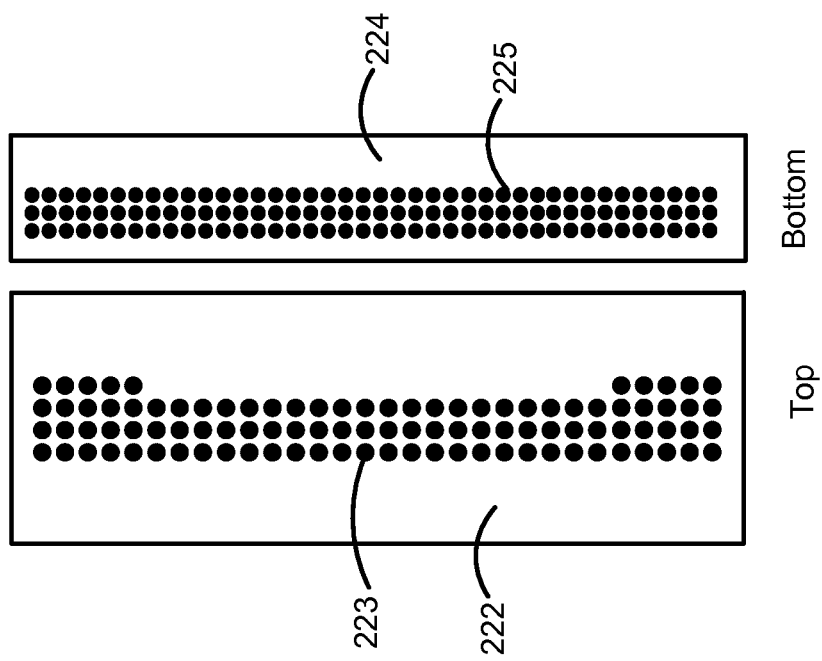
FIG. 3 illustrates top and bottom surfaces of an interposer according to an embodiment of the present invention.

FIG. 3 illustrates top and bottom surfaces of an interposer according to an embodiment of the present invention. In this figure, top surface 222 may include contacts 223 while a bottom surface 224 may include contacts 225. Again, contacts 223 on top surface 222 may be larger than contacts 225 on bottom surface 224. Top surface 222 may include more contacts than bottom surface 224. This may be useful where one ground contact on a bottom surface 224 may be connected to two or more ground contacts on the top surface 222. This may improve shielding, reduce ground resistance, or be used other reasons. Contacts 223 and 225 may convey power, ground, data, test points, or other signals, voltages, currents, or other information.

Embodiments of the present invention may be manufactured using various techniques. One such technique is outlined in the following figures.

Figure 4:
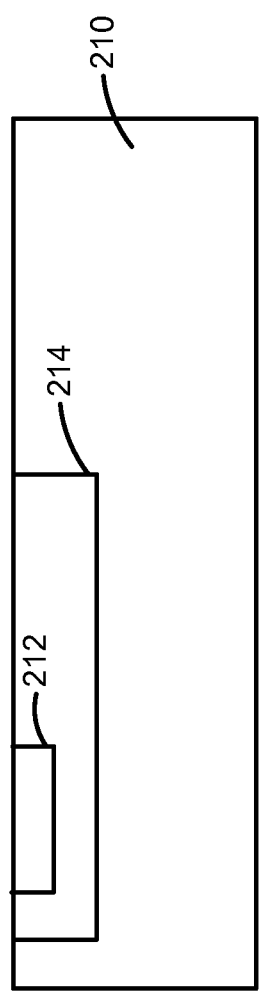
FIG. 4 illustrates a step in a method of manufacturing a portion of an electronic device according to an embodiment of the present invention.

FIG. 4 illustrates a step in a method of manufacturing a portion of an electronic device according to an embodiment of the present invention. In this figure, a first board 210 having interconnect traces 212 and 214 may be provided. Interconnect traces 212 and 214 may be representative of traces that may be on or in printed circuit board 210.

Figure 5:
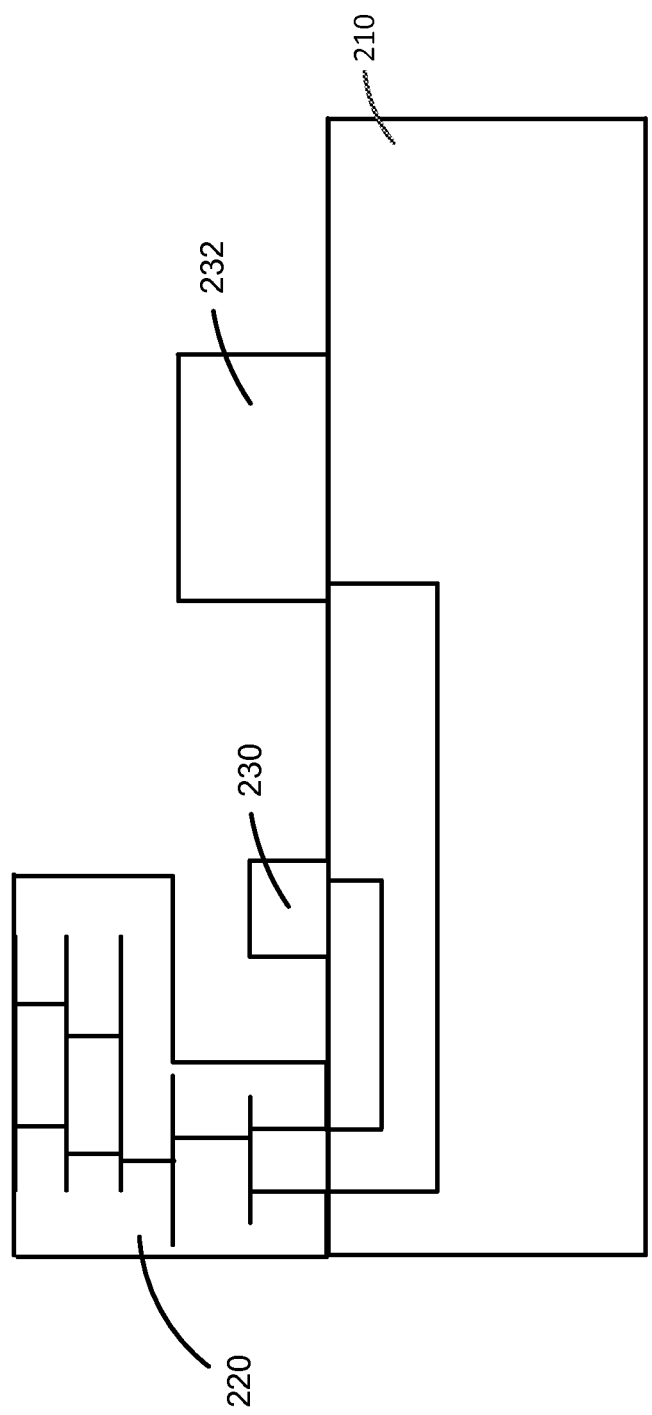
FIG. 5 illustrates a step in a method of manufacturing a portion of an electronic device according to an embodiment of the present invention.

FIG. 5 illustrates a step in a method of manufacturing a portion of an electronic device according to an embodiment of the present invention. In this figure, devices, circuits, or components 230 and 232, as well as interposer 220, may be attached to a surface of first board 210. Devices, circuits, or components 230 and 232 may be surface mount devices. Again, interposer 220 may also be, or may be treated as, a surface mount device. Again, devices, circuits, or components 230 and 232 may be electrically connected to interposer 220 through traces on a first board 210. In this and the other examples herein, one or more devices, circuits, or components 230 and 232 and interposer 220 may be other types of device, such as through-hole devices.

Figure 6:
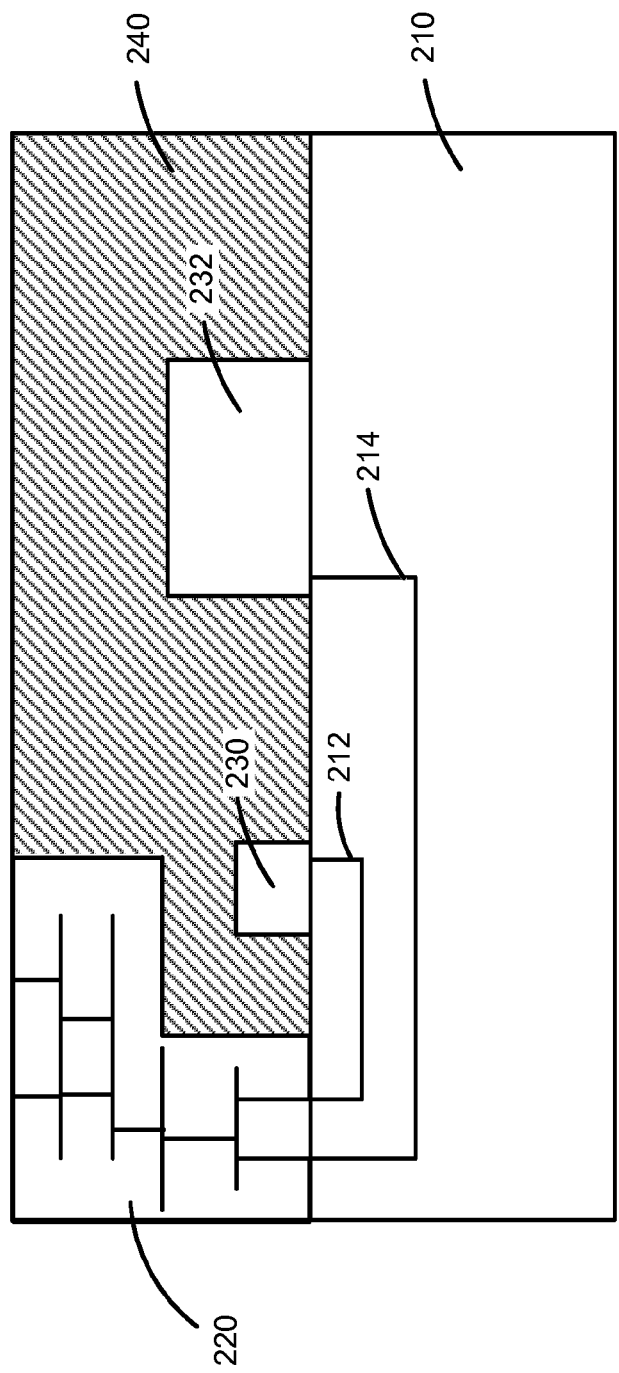
FIG. 6 illustrates a step in a method of manufacturing a portion of electronic device according to an embodiment of the present invention.

FIG. 6 illustrates a step in a method of manufacturing a portion of electronic device according to an embodiment of the present invention. In this figure, plastic encapsulation 240 may be formed or molded around devices, circuits, or components 230 and 232, and along at least an edge of interposer 220. A top surface of molding 240 may be at least approximately aligned with a top surface of interposer 220. Once the plastic encapsulation is complete, second board 250 may be attached as shown in FIG. 2. Again, in various embodiments of the present invention, molding 240 may be absent or optional.

Figure 7:
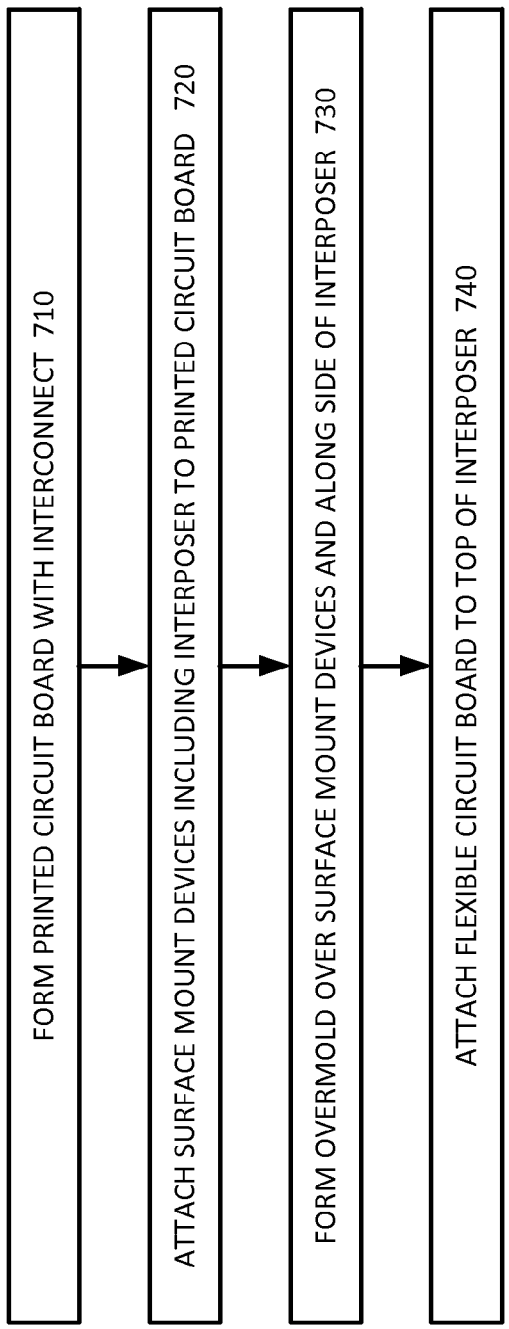
FIG. 7 is a flowchart of a method of manufacturing a portion of an electronic device according to an embodiment of the present invention.

FIG. 7 is a flowchart of a method of manufacturing a portion of an electronic device according to an embodiment of the present invention. A printed circuit board having interconnect traces may be formed in act 710. In act 720, surface mount devices including an interposer may be attached to a top surface of printed circuit board. A plastic overmold or encapsulation over the surface mount devices and along at least a side of the interposer may be formed in act 730. In act 740, a flexible circuit board may be attached to a top surface of the interposer.

In the above example, interposer 220 may be notched or stepped such that plastic encapsulation 240 is also notched or stepped. In other embodiments of the present invention, the interposer may be notched or stepped such that it has a portion over the plastic encapsulation. An example is shown in the following figure.

Figure 8:
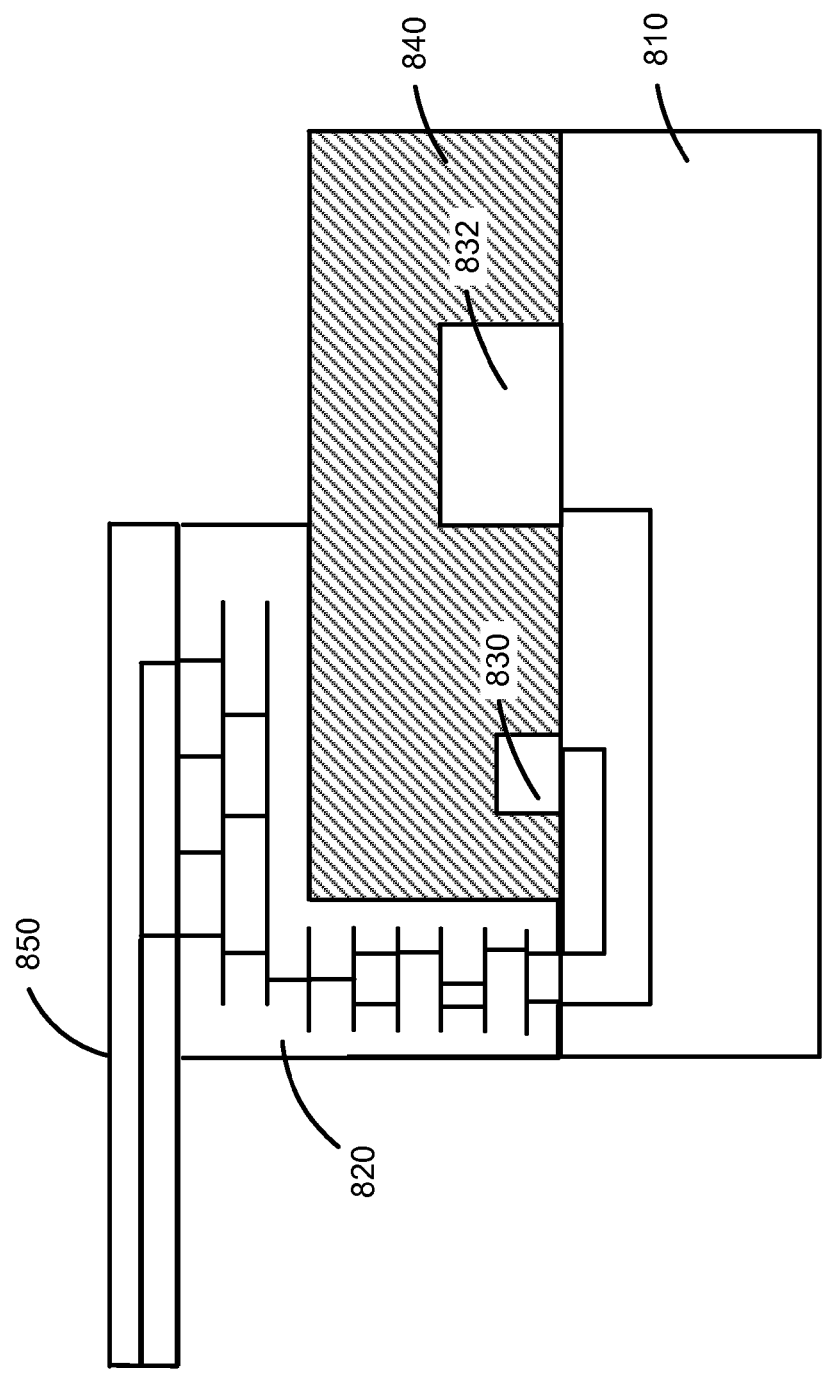
FIG. 8 illustrates a portion of an electronic device according to an embodiment present invention.

FIG. 8 illustrates a portion of an electronic device according to an embodiment present invention. In this example, devices, circuits, or components 830 and 832 may be mounted to a top surface of a first board 810. Devices, circuits, or components 830 and 832 may be encapsulated in a plastic encapsulation 840. An interposer 820 may be placed along an edge and over a top of the encapsulation 840. Second board 850 may be attached to a top surface of interposer 820. While interposer 820 is shown as overhanging molded portion 840, in other embodiments of the present invention, interposer 820 may overhang other devices or circuits, such as a packaged integrated circuit.

In still other embodiments of the present invention, a flexible circuit board or other interconnect structure may be formed as part of the interposer. An example is shown in the following figure.

Figure 9:
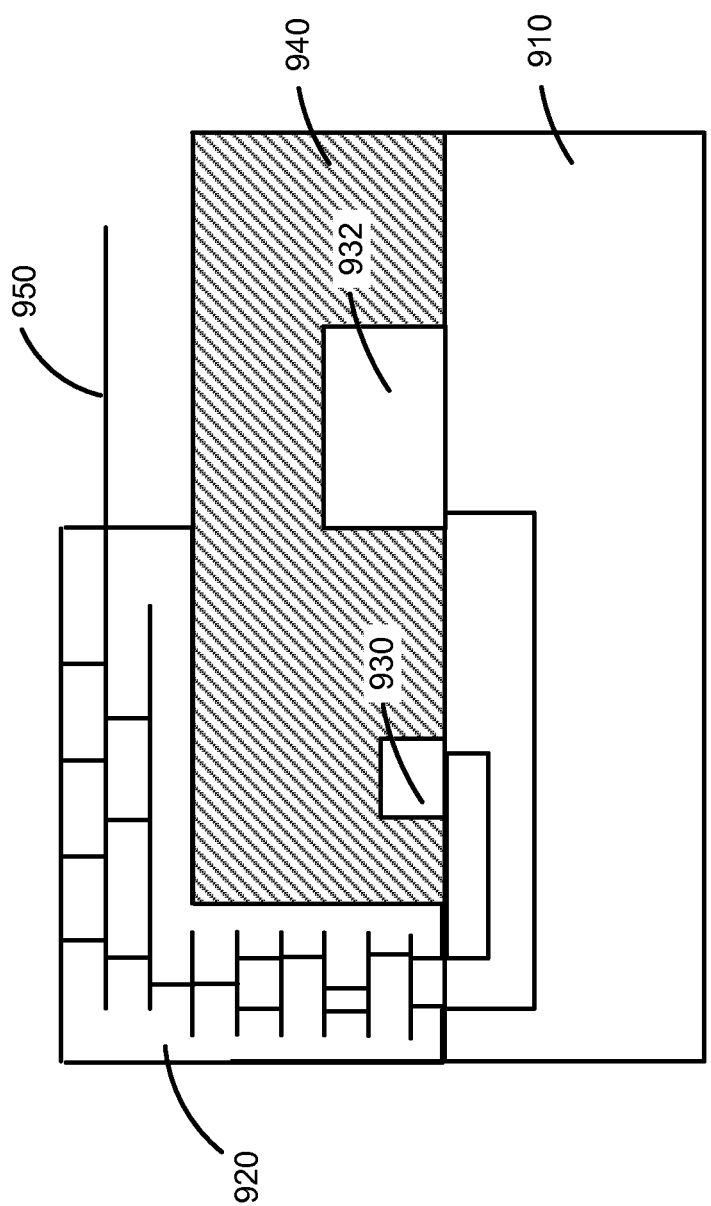
FIG. 9 illustrates a portion of an electronic device according to an embodiment of the present invention.

FIG. 9 illustrates a portion of an electronic device according to an embodiment of the present invention. As before, devices, circuits, or components 930 and 932 may be attached to a top surface of first board 910 and covered in plastic encapsulation 940. Intermediate layers of interposer 920 may be used to form flexible circuit board 950. Flexible circuit board 950 may connect to other components and circuits in or associated with the electronic device.

These interposers and other interconnect structures consistent with embodiments of the present invention may be located in different places on system-in-a-package modules. Examples are shown in the following figures.

Figure 10:
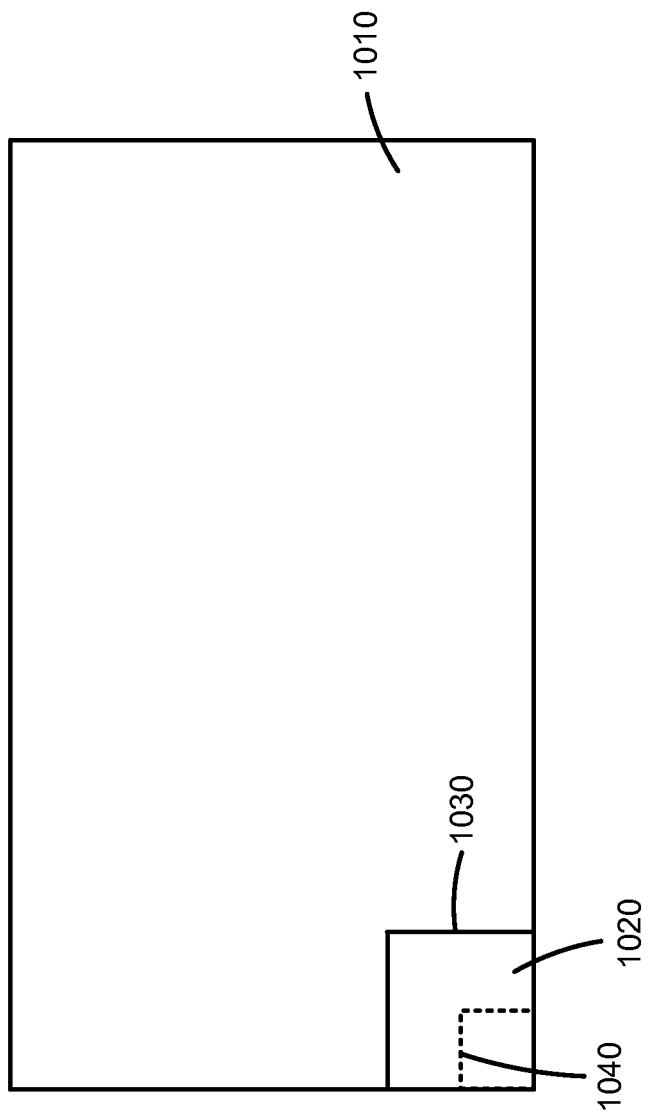
FIG. 10 illustrates a location of an interposer in a system-in-a-package module according to an embodiment of the present invention.

FIG. 10 illustrates a location of an interposer in a system-in-a-package module according to an embodiment of the present invention. Interposer 1020 may have a bottom surface 1040 and a top surface 1030. Interposer 1020 may be located in a corner of system-in-a-package module 1010.

Figure 11:
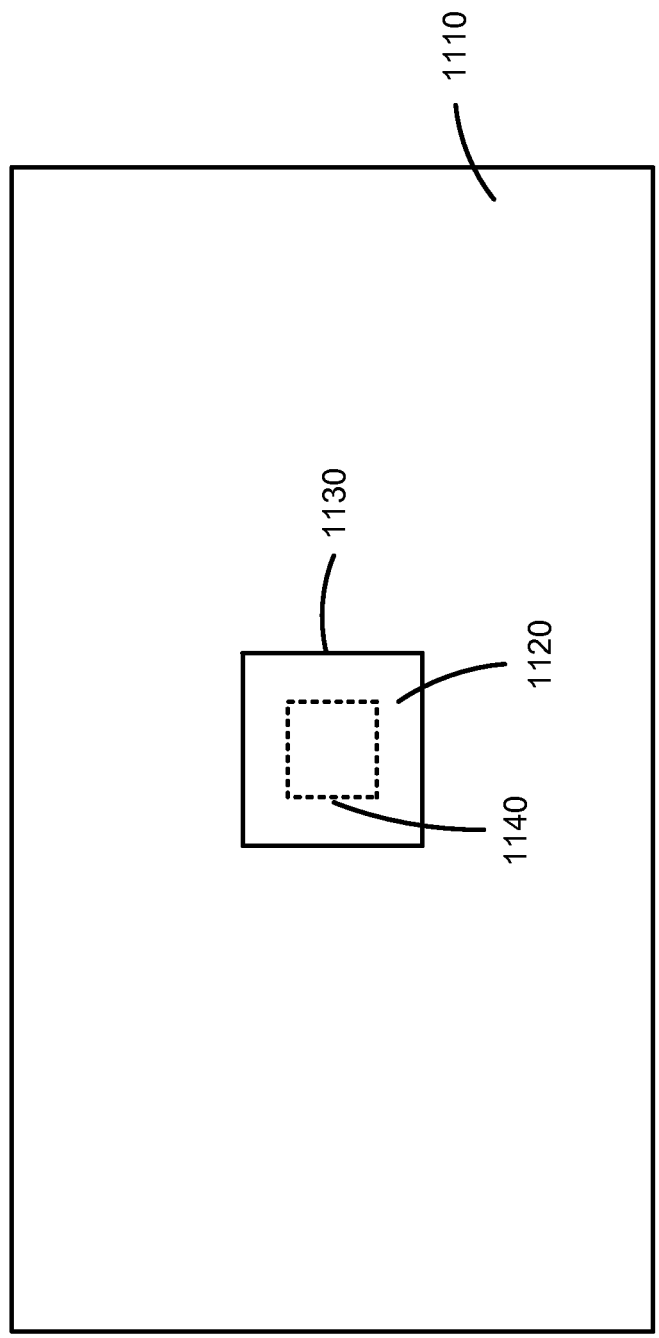
FIG. 11 illustrates a location of an interposer in a system-in-a-package module according to an embodiment of the present invention.

FIG. 11 illustrates a location of an interposer in a system-in-a-package module according to an embodiment of the present invention. Interposer 1120 may have a bottom surface 1140 and a top surface 1130. Interposer 1120 may be located in a center of a system-in-a-package module 1110. In still other embodiments of the present invention, these interposers may be located along an edge of a module, along two or more edges of a module, or they may be distributed in more than one location in a module. Also, while interposers may be located in these areas, other interconnect structures, such as the pins described below, may be placed in these or similar locations.

In still other embodiments of the present invention, other interconnect structures may be used in place of an interposer. For example, one or more pins, which may be distributed throughout a system-in-a-package module or arranged as a group or array on the module, may be used as an interconnect structure. An example is shown in the following figures.

Figure 12:
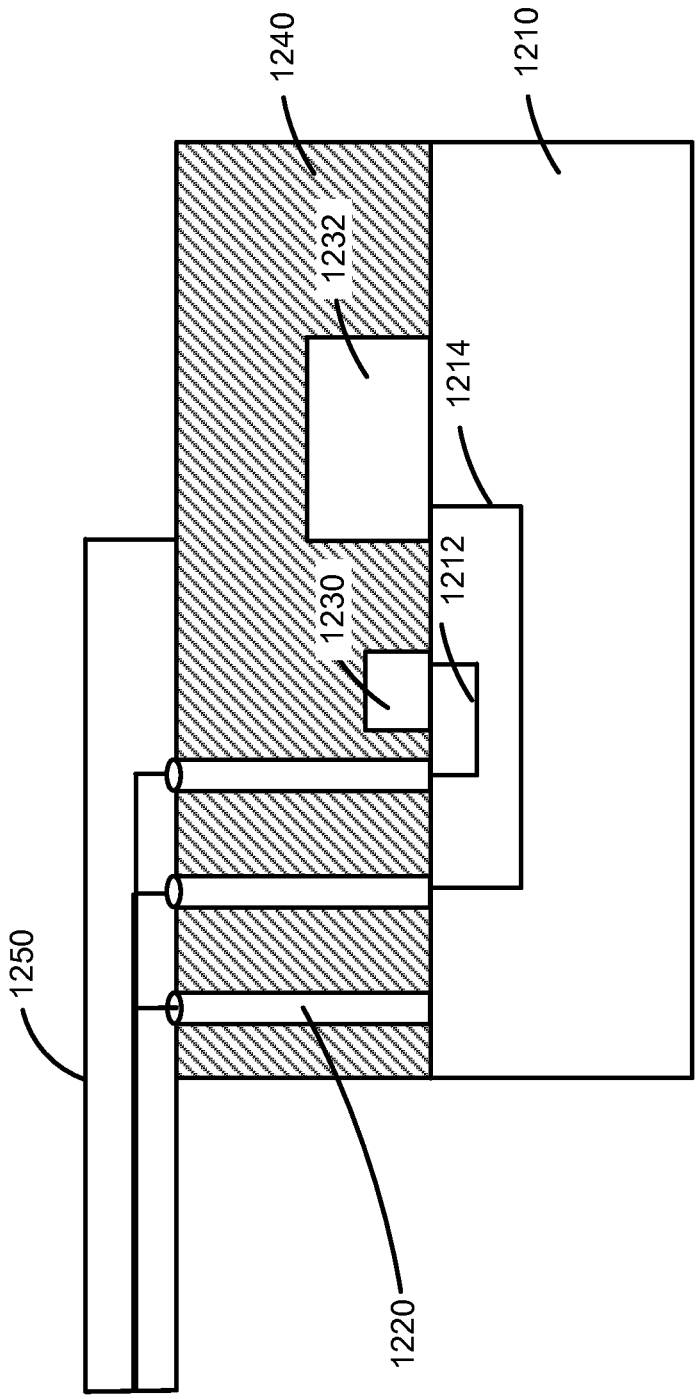
FIG. 12 illustrates a portion of an electronic device according to an embodiment of the present invention.

FIG. 12 illustrates a portion of an electronic device according to an embodiment of the present invention. As before, devices, circuits, or components 1230 and 1232 may be attached to a top surface of a first board 1210. Interconnect traces 1212 and 1214 may electrically connect devices, circuits, or components 1230 and 1232 to pins 1220. Pins 1220 may provide electrical connections to traces in second board 1250. A plastic housing or encapsulation 1240 may surround devices, circuits, or components 1230 and 1232 and pins 1220. In this way, devices, circuits, or components 1230 and 1232 may electrically connect to traces in second board 1250 via interconnect traces 1212 and 1214 and pins 1220.

The above interconnect structure may be formed in various ways. One example is shown in the following figures.

Figure 13:
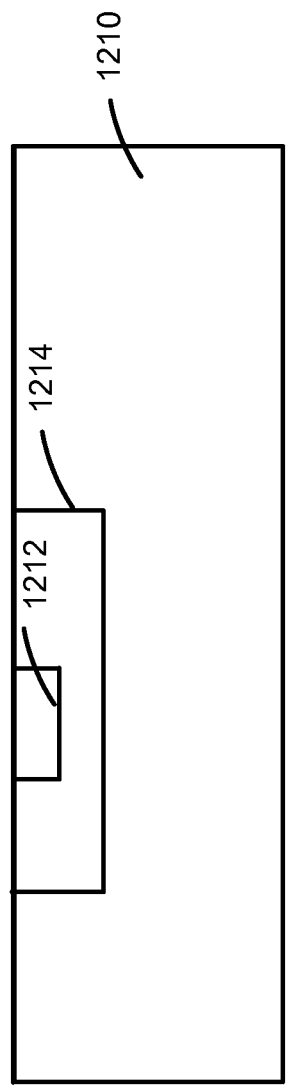
FIG. 13 illustrates a step and a method of manufacturing a portion of an electronic device according to an embodiment of the present invention.

FIG. 13 illustrates a step in a method of manufacturing a portion of an electronic device according to an embodiment of the present invention. In this figure, a first board 1210 having interconnect traces, illustrated here as interconnect traces 1212 and 1214, may be provided. Interconnect traces 1212 and 1214 may be located in or on first board 1210. First board 1210 may be a printed circuit board, flexible circuit board, or other appropriate substrate.

Figure 14:
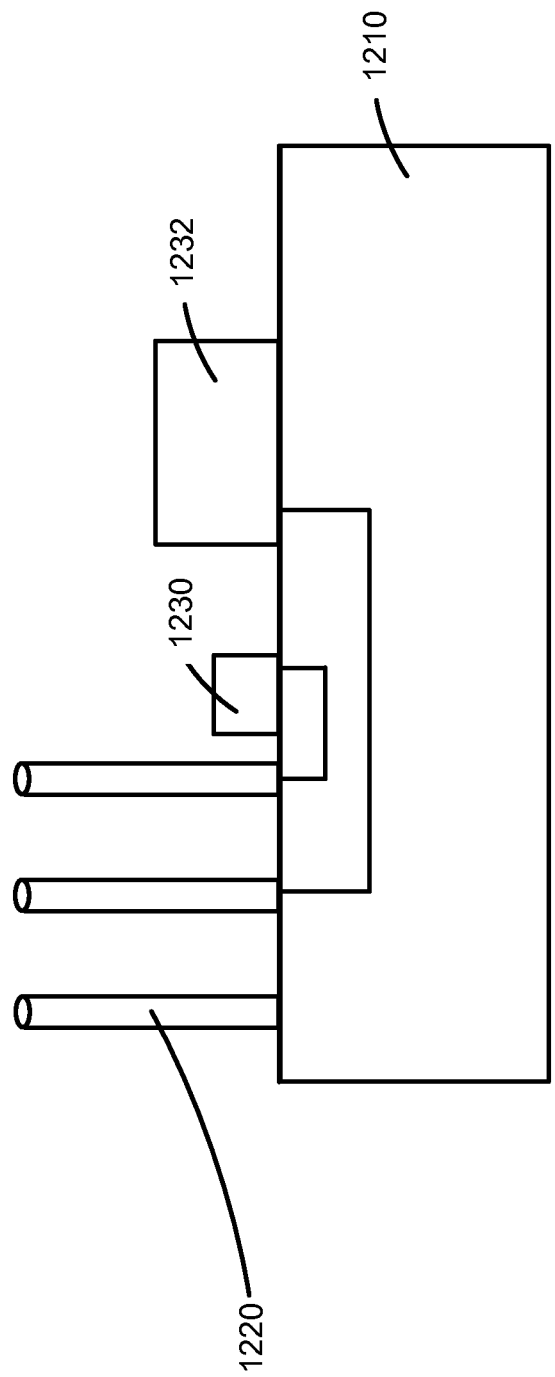
FIG. 14 illustrates a step in a method of manufacturing a portion of an electronic device according to an embodiment of the present invention.

FIG. 14 illustrates a step in a method of manufacturing a portion of an electronic device according to an embodiment of the present invention. In this example, devices, circuits, or components 1230 and 1232 may be attached to a top surface of first board 1210. One or more pins 1220 may also be attached. These pins may be attached in a group or they may be distributed throughout a surface of first board 1210.

Figure 15:
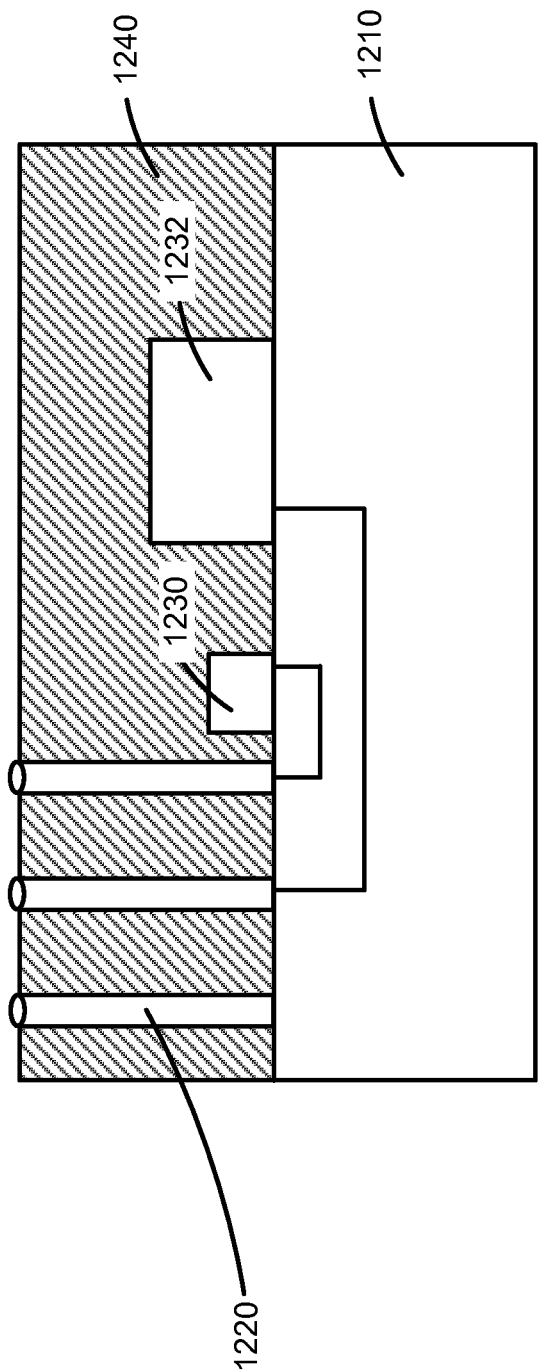
FIG. 15 illustrates a step in a method of manufacturing a portion of an electronic device according to an embodiment of the present invention.

FIG. 15 illustrates a step in a method of manufacturing a portion of an electronic device according to an embodiment of the present invention. In this example, plastic encapsulation 1240 is placed over devices, circuits, or components 1230 and 1232 and around pins 1220. Top surfaces of pins 1220 may be exposed. This may require a top surface of plastic encapsulation 1240 to be etched, laptop or otherwise reduced or lowered. Once this is completed, circuit board 1250 may be attached as shown in FIG. 12. In various embodiments of the present invention, not all pins 1220 are connected to second board 1250. For example, some pins 1220 may be provided at the surface of the molded plastic or encapsulation 1240 for test, programming, or diagnostic purposes.

Figure 16:
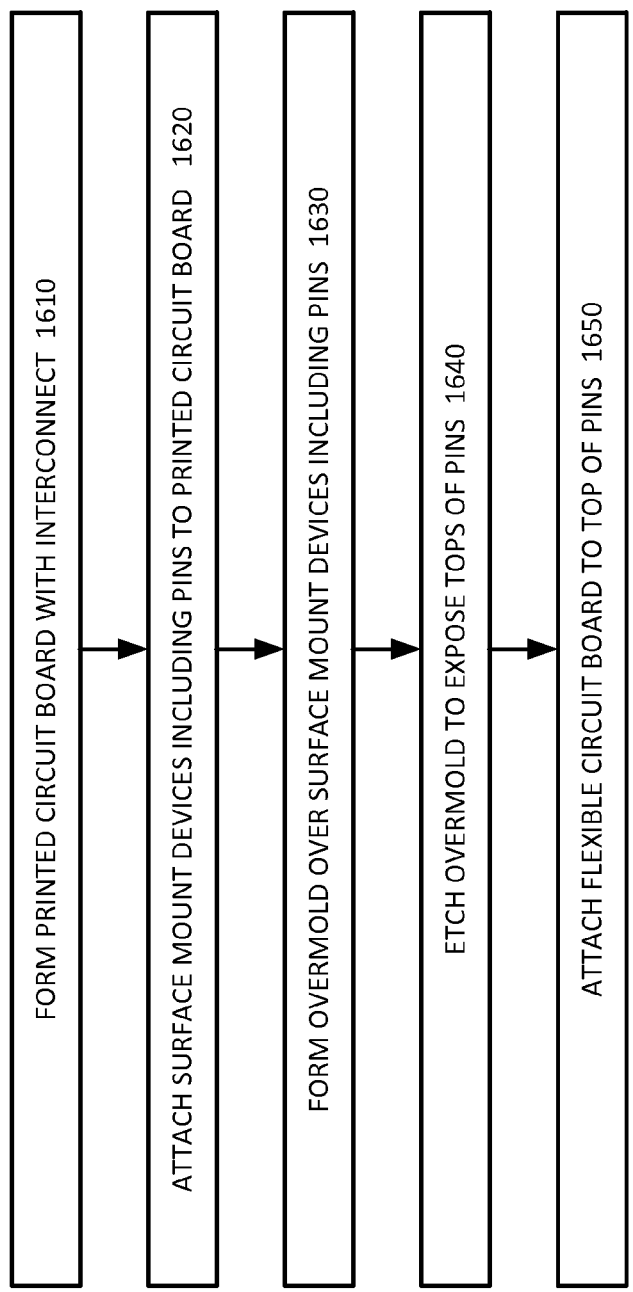
FIG. 16 illustrates a method of manufacturing a portion of electronic device according to an embodiment of the present invention.

FIG. 16 illustrates a method of manufacturing a portion of electronic device according to an embodiment of the present invention. In act 1610, a printed circuit board having a number of interconnect traces may be formed. Surface mount devices including pins may be attached to a top surface of a printed circuit board in act 1620. An overmold over the surface mount devices and around the pins may be formed in act 1630. In act 1640, the overmold may be etched, lapped, or otherwise reduced to expose the top of the pins. A flexible circuit board may be attached to the tops of the pins in act 1650.

Again, other embodiments of the present invention may provide other interconnect structures for forming electrical paths between a system-in-a-package module and other circuits or components in an electronic device. For example, a number of contacts may be used, either in conjunction with interposers and pins, or by themselves. Examples are shown in the following figures.

Figure 17:
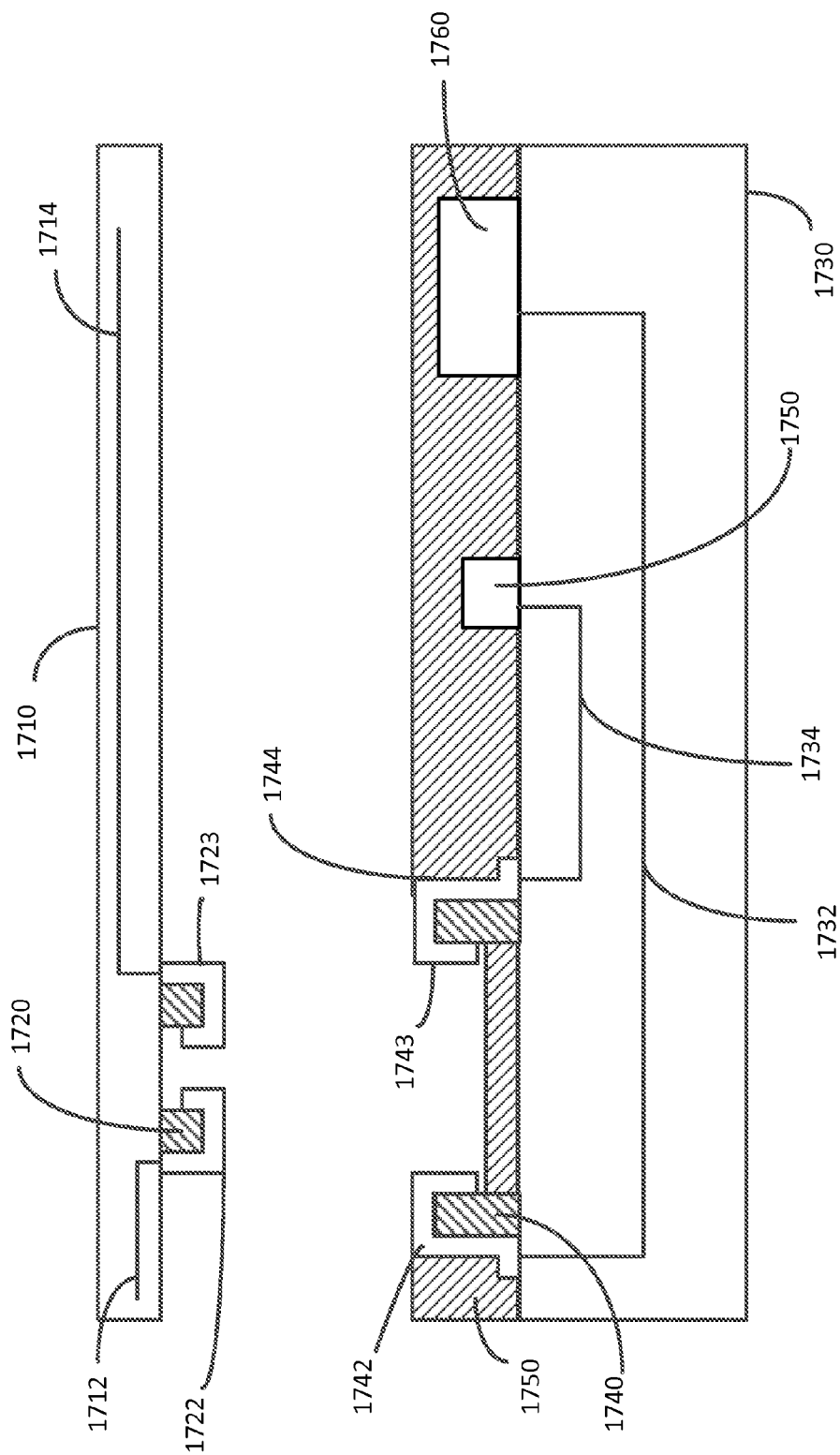
FIG. 17 illustrates a portion of an electronic device according to an embodiment of the present invention.

FIG. 17 illustrates a portion of an electronic device according to an embodiment of the present invention. This portion of an electronic device may include a board 1730. The board 1730 may support a number of traces, such as traces 1732 and 1734. These traces may be formed in or on a printed circuit board using traces on different levels and vias between different levels of the board. In this way, board 1730 may support traces 1732 and 1734. In various embodiments the present invention, board 1730 may be a printed circuit board, flexible circuit board, or other appropriate substrate.

A number of electronic or mechanical components and circuits, shown in these examples as representative devices 1750 and 1760, may be attached to a top surface of board 1730. These components or circuits may be surface mount devices, such as integrated circuits, or other devices. These devices may attach to traces supported by board 1730 through leads in a package, through wire bonds, or by other means.

Contacts 1742 may also be attached to a top surface of printed circuit board 1730. For example, contacts 1742 may be soldered to pads or contacts formed on a top surface of printed circuit board 1730. Contacts 1742 may be held in place by one or more carriers 1740. These carriers 1740 may be removed after contacts 1742 are attached to board 1730, or carriers 1740 may be left in place. Again, carriers 1740 are optional and may not be used in various embodiments of the invention. Contacts 1742, as with the other contacts here, may have different configurations in various embodiments of the present invention. For example, where a typical connector may include two rows having equal numbers of contacts, embodiments of the present invention may arrange contacts 1742 in any pattern and having any the number of contacts 1742 as needed for a specific application. That is, the shapes formed by the arrangement of contacts 1742 may not be orthogonal or symmetrical and to the extent that rows are used, each row does not need to have the same number of contacts 1742.

An overmold or plastic encapsulation 1750 may then be applied covering components 1750 and 1760 and some or all of each contact 1742. An inside edge or surface 1743 of contacts 1742 may be exposed. This inside edge or surface 1743 may be exposed by removing a portion of overmold 1750. This portion of overmold 1750 may be removed using a laser, by etching, by micromachining, or by blocking the overmold during the molding process.

While in this example inside edges or surfaces 1743 of contacts 1742 may be exposed, in other embodiments of the present invention, outside edges or surfaces 1744 of contacts 1742 may be exposed. The outside surfaces 1744 of contacts 1742 may be exposed by etching or blocking molding 1750.

In various embodiments of the present invention, system-in-a-package modules may use one or more interposers, contacts, pins, and other structures in various combinations for forming electrical connections to other circuits or components in an electronic device.

An interconnect structure 1710 may also be provided. Interconnect structure 1710 may be a printed circuit board, flexible circuit board, ribbon cable, or other interconnect structure. Interconnect structure 1710 may include a number of traces 1712 and 1714. These traces may connect to contacts 1722 on a bottom surface of interconnect structure 1710. As with contacts 1742, one or more carriers 1720 may be used to secure contacts 1722 in place relative to each other. Interconnect structure 1710 may be mated with the first board 1730 such that contacts 1722 are mated with contacts 1742. Specifically, outside edges or surfaces 1723 of contacts 1722 may electrically contact an inside edge 1743 of contacts 1742. An example is shown in the following figure.

Figure 18:
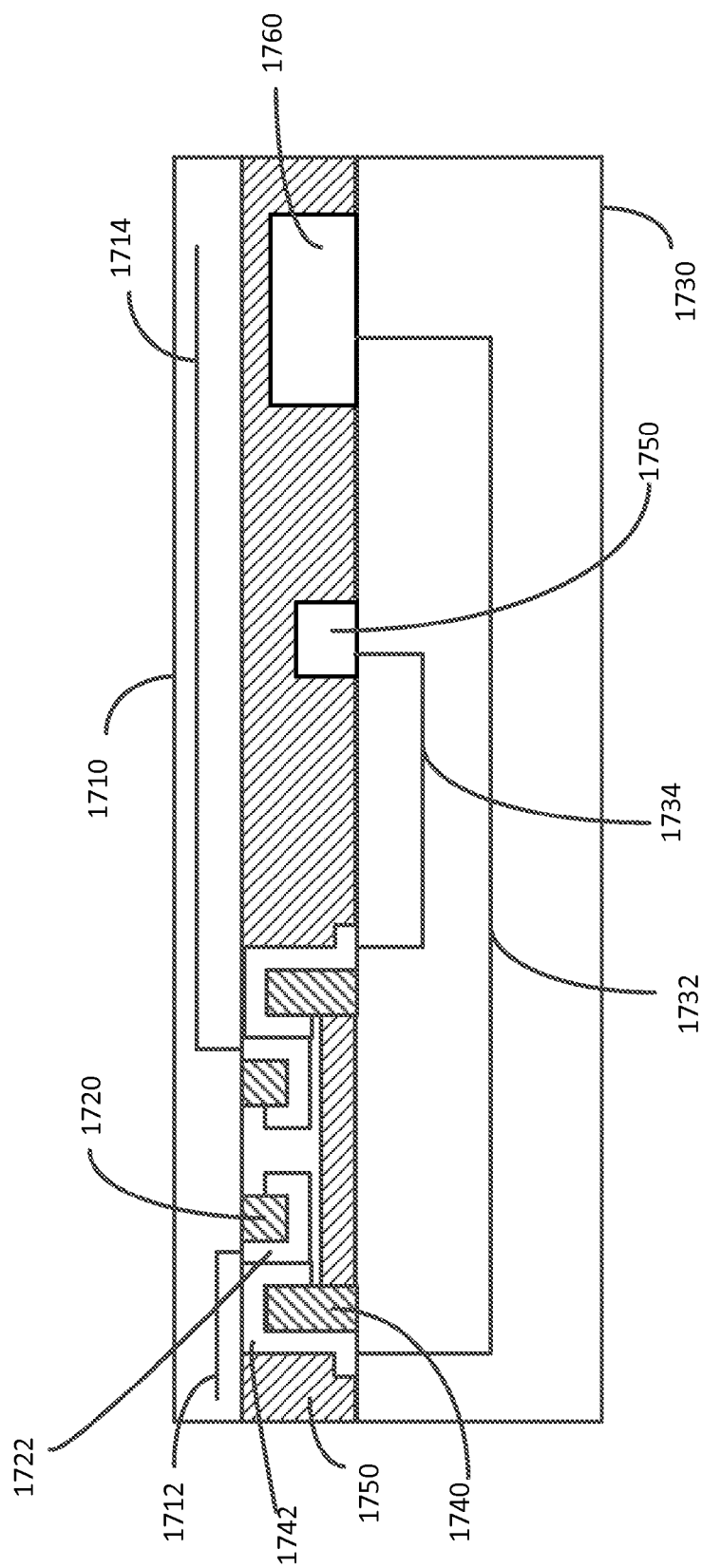
FIG. 18 illustrates a portion of electronic device according to an embodiment of the present invention.

FIG. 18 illustrates a portion of electronic device according to an embodiment of the present invention. In this example, interconnect structure 1740 has been mated with first board 1730. Specifically, contacts 1722 are in electrical contact with contacts 1742. In this way, traces 1712 and 1714 on interconnect structure 1710 may electrically connect through contacts 1722 and contacts 1742 to components 1750 and 1760 via traces 1732 and 1734 in board 1730. Overmold 1750 may at least partially cover contacts 1742 holding them in place. Carriers 1720 and 1740 may be left in place or removed after their respective contacts 1722 and 1742 have been attached to their respective boards 1710 and 1730.

These system-in-a-package modules may be formed in various ways. An example is shown in the following figures.

Figure 19:
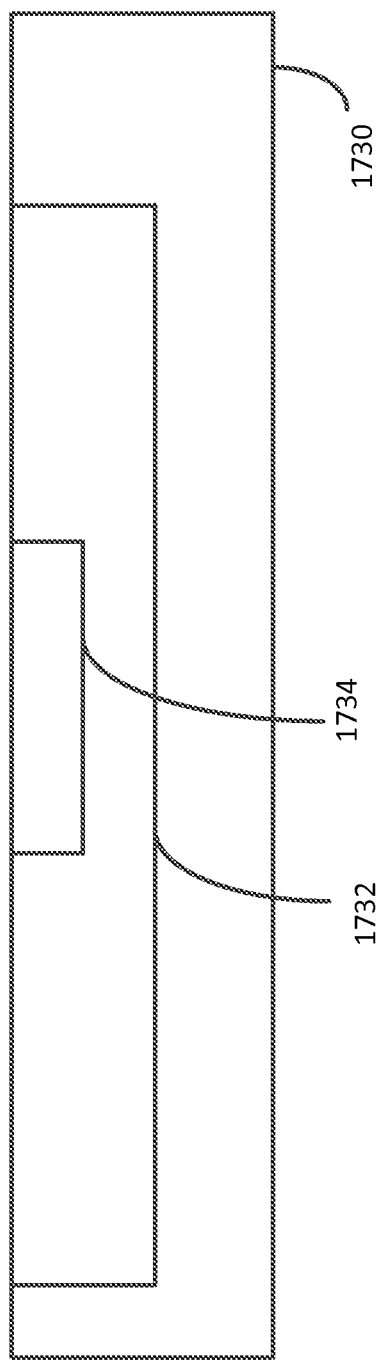
FIG. 19 illustrates a board that may be used in forming a system-in-a-package module for an electronic device according to an embodiment of the present invention.

FIG. 19 illustrates a board that may be used in forming a system-in-a-package module for an electronic device according to an embodiment of the present invention. Board 1730 having a number of traces 1732 and 1734 may be formed. Traces 1732 and 1734 may be traces routed along levels in the printed circuit board and through vias routed between levels of the printed circuit board.

Figure 20:
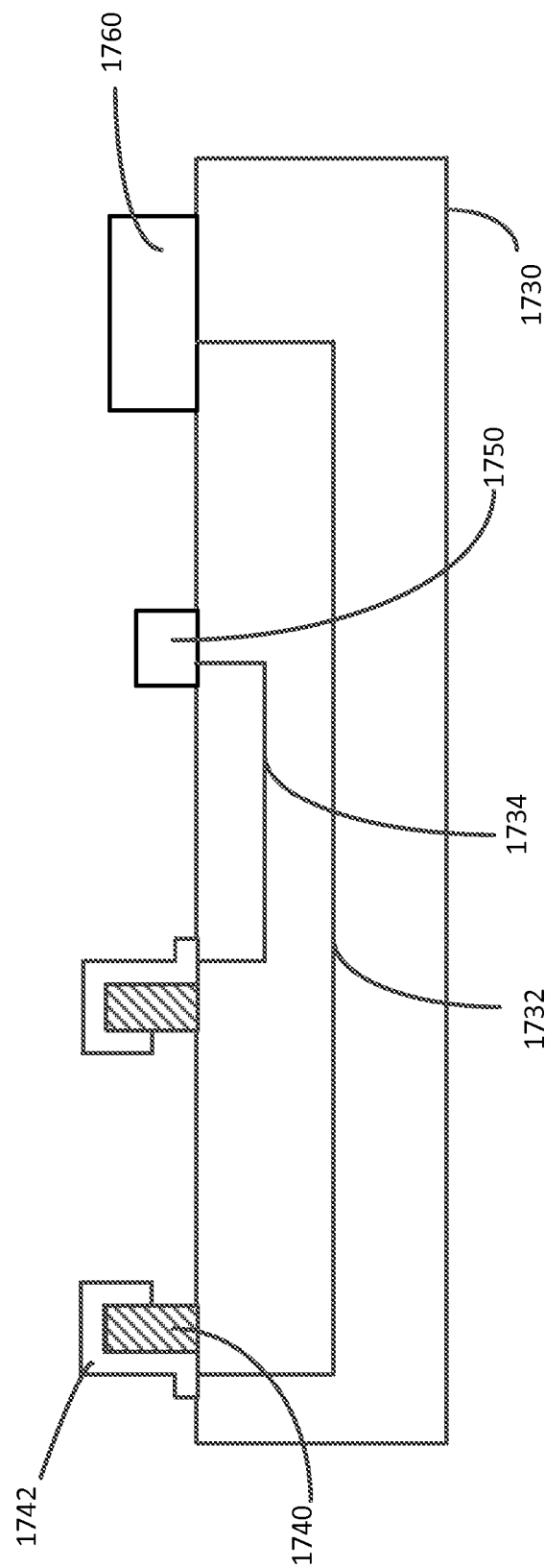
FIG. 20 illustrates a board supporting a number of components and contacts according to an embodiment of the present invention.

FIG. 20 illustrates a board supporting a number of components and contacts according to an embodiment of the present invention. In this example, one or more electrical or mechanical components or circuits, shown here as representative components 1750 and 1760, may be attached to a top surface of board 1730. Contacts 1742 may be held in place relative to each other with carrier 1740. Contact 1742 may be soldered or otherwise attached to contacts or pads on a top surface of board 1730. Carriers 1740 may be removed after the contacts are soldered down or attached, through carriers 1740 may be left in place or not used at all in various embodiments of the present invention. Contact 1742 may be electrically connected to one or more components 1750 or 1760 via traces 1732 and 1734.

Figure 21:
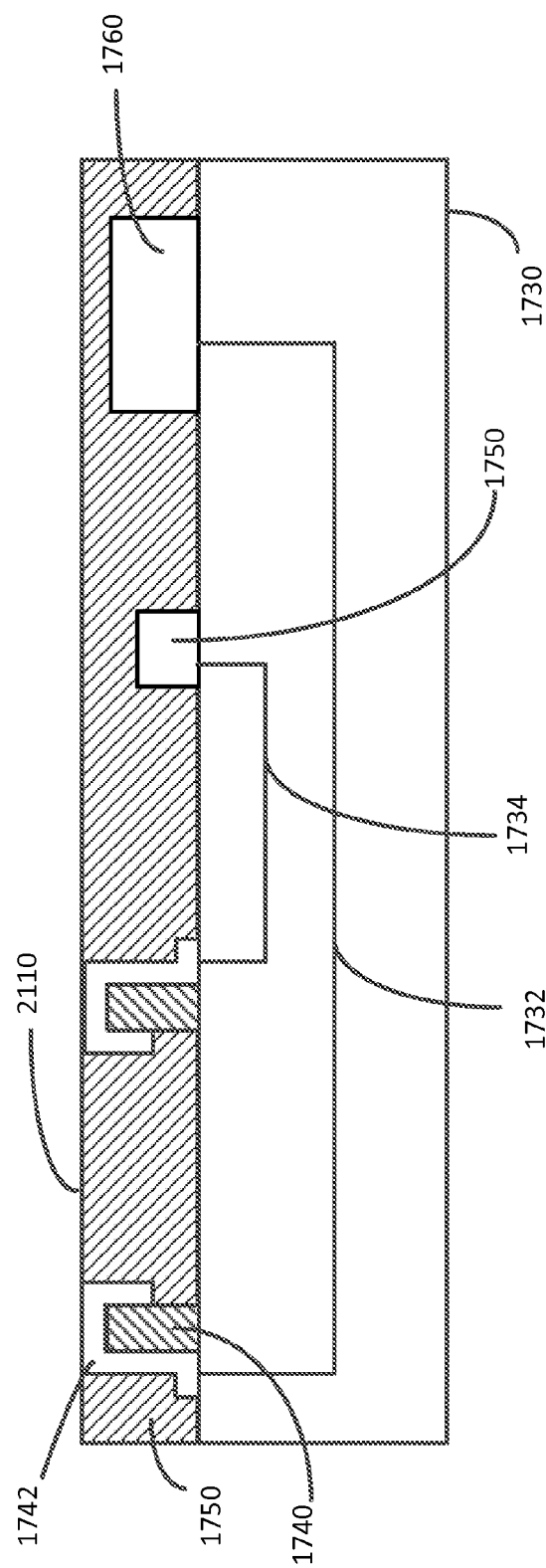
FIG. 21 illustrates the board of FIG. 20 where an overmold or plastic encapsulation has been formed over components and at least a portion of each of a plurality of contacts.

FIG. 21 illustrates the board of FIG. 20 where an overmold or plastic encapsulation has been formed over components and at least a portion of a plurality of contacts. In this example, overmold 1750 is shown as having a similar height as contact 1742, though in other embodiments of the present invention, a height of contacts 1742 may exceed a depth of overmold 1750, while in other embodiments, overmold 1750 may cover a top of contacts 1742.

To provide access to contacts 1742, an area 2110 between contact 1742 may be removed to expose inside surfaces of contacts 1742. Again, in various embodiments of the present invention, molding 1750 may be etched to expose outside surfaces of contacts 1742. Area 2110 may be etched using a laser, chemical etch, micro-machining, or other appropriate technique. After etching, the structure shown in FIG. 17 may be the result.

Figure 22:
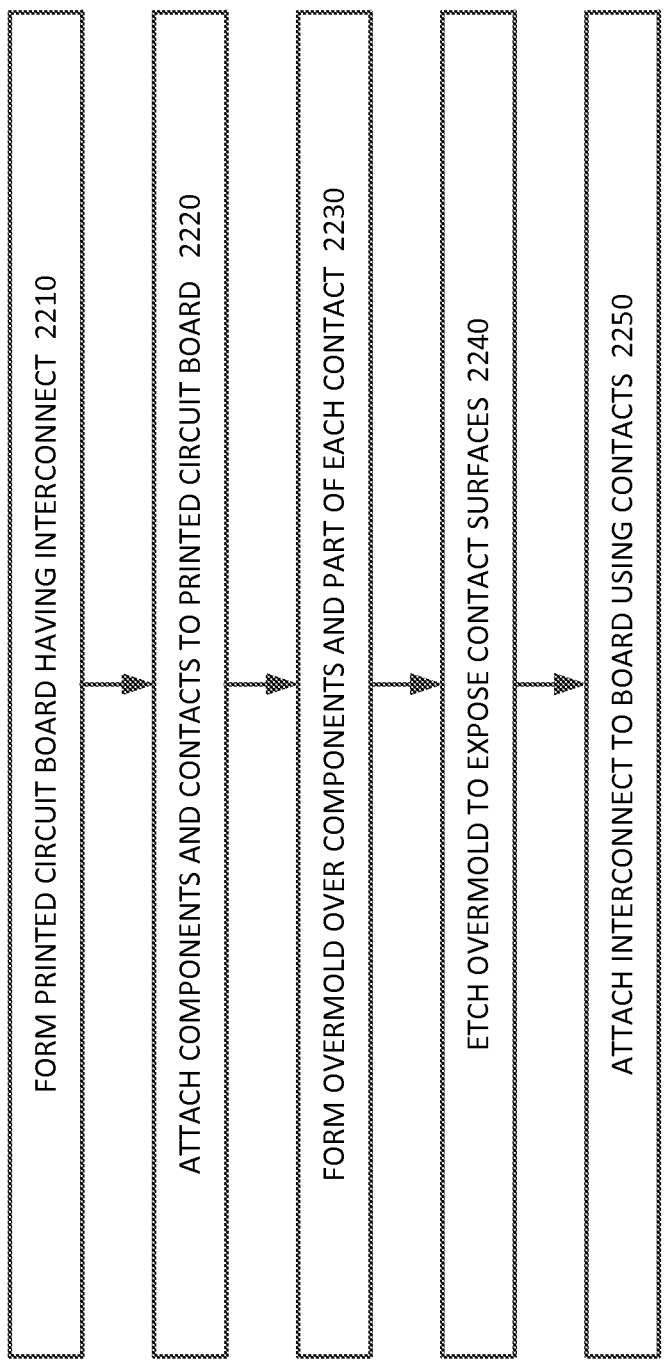
FIG. 22 is a flowchart of a method of forming a system-in-a-package module according to an embodiment of the present invention.

FIG. 22 is a flowchart of a method of forming a system-in-a-package module according to an embodiment of the present invention. In act 2210, a printed circuit board with interconnect may be formed. Surface mount or other electrical c or mechanical components and contacts may be attached on the printed circuit board in act 2220. An overmold or plastic encapsulation may be formed over the components and at least a portion of each of the contacts in act 2230. The overmold may be etched to expose portions of contacts in act 2240, and contacts on a interconnect structure may be attached to the contacts on the board in act 2250.

Again, area 2120 may be etched to expose inside surfaces 1744 of contacts 1742. In other embodiments of the present invention, a blocking or other structure may be used to cover and inside surface of contacts 1742 when overmold 1750 is formed. An example is shown in the following figure.

Figure 23:
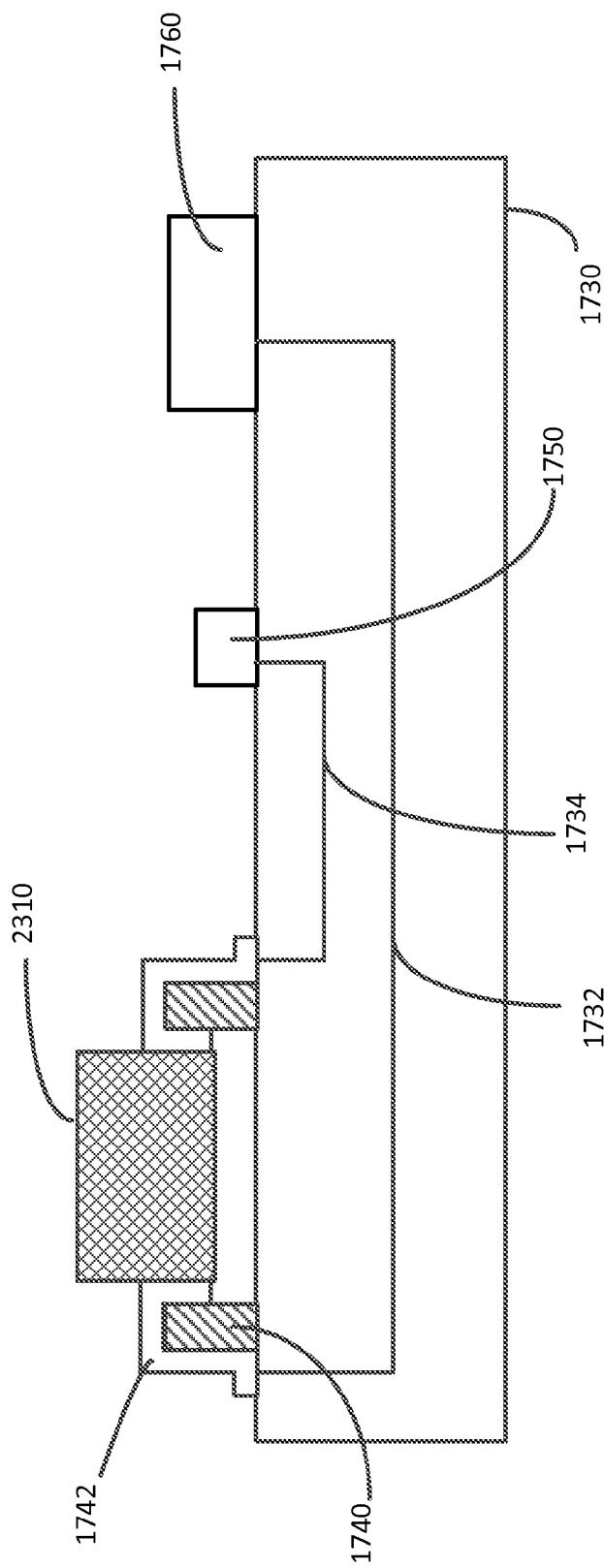
FIG. 23 illustrates a step in a method of forming a portion of electronic device according to an embodiment of the present invention.

FIG. 23 illustrates a step in a method of forming a portion of electronic device according to an embodiment of the present invention. As before, board 1730 may include traces 1732 and 1734. Traces 1732 and 1734 may electrically connect contacts 1742 to components 1750 and 1760. Contacts 1742 may be held in place by carrier 1740, though carrier 1740 may be optional or may be removed.

A blocking or other structure 2310 may be placed between contacts 1742 in order to protect their inside surfaces. As overmold or plastic encapsulation 1750 is formed, blocking or other structure 2310 may prevent the overmold from covering these inside contact surfaces.

Figure 24:
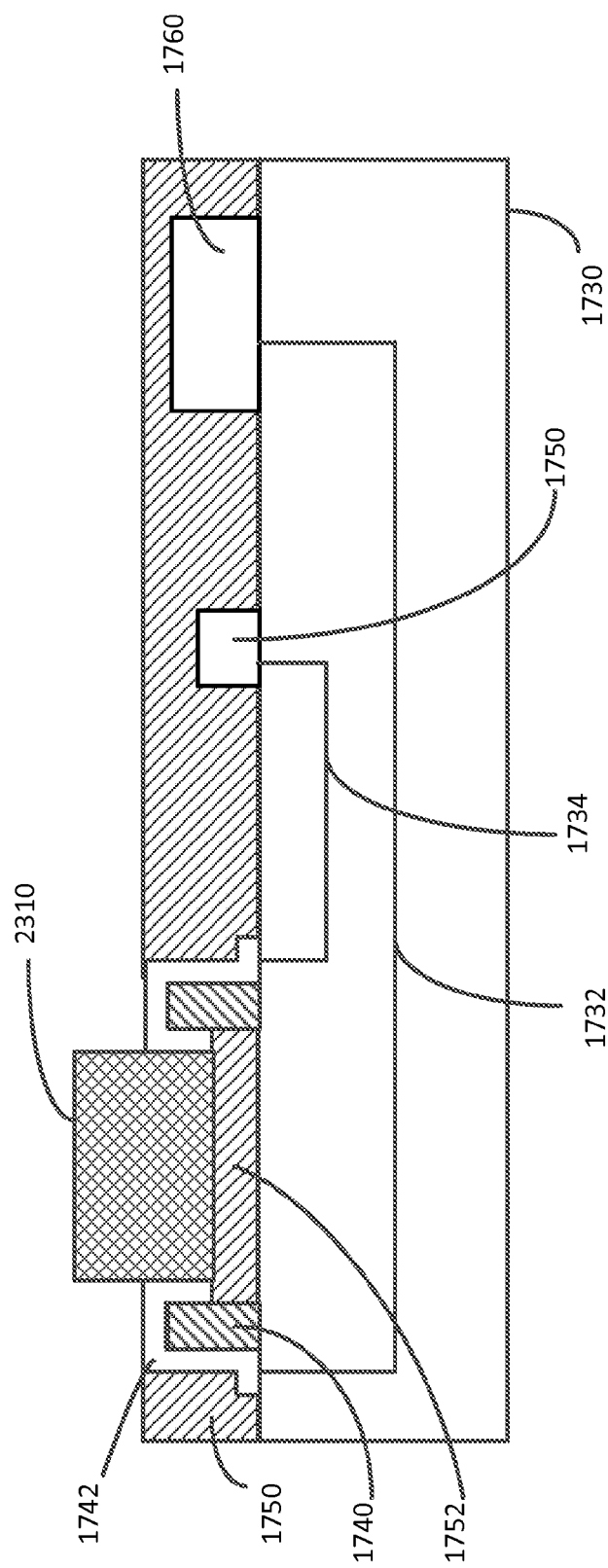
FIG. 24 illustrates a following step in a method of forming a portion of an electronic device according to an embodiment of the present invention.

FIG. 24 illustrates a following step in a method of forming a portion of an electronic device according to an embodiment of the present invention. In this example, overmold 1750 has been formed over components 1750 and 1760 and over at least a portion of each of the contacts 1742. Blocking or other structure 2310 has prevented molding 1750 from covering the inside surfaces of contacts 1742. An area 1752 under the blocking or other structure 2310 may be filled with overmold, though this area may be blocked as well in other embodiments of the present invention. Blocking or other structure 2310 may be removed after the overmold or plastic encapsulation formation is complete.

Figure 25:
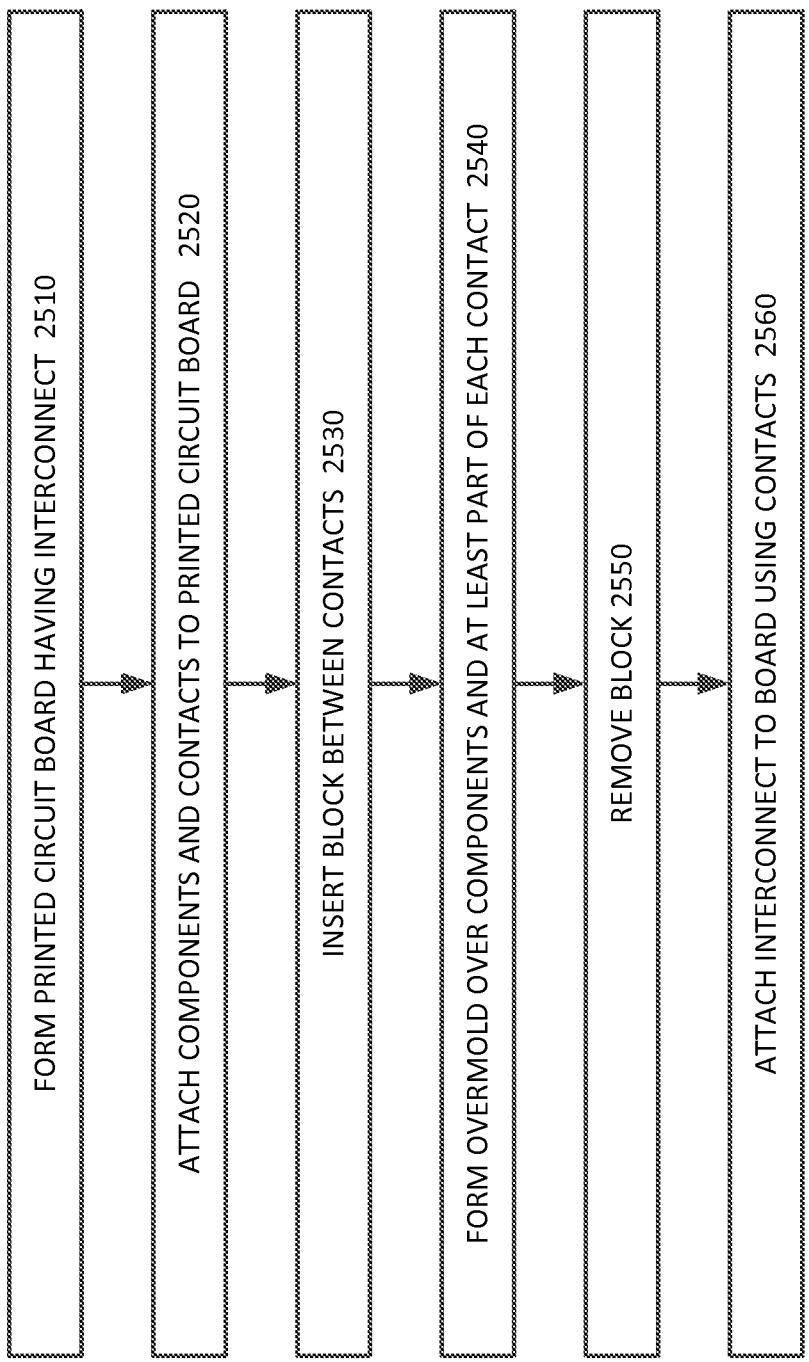
FIG. 25 illustrates a method of forming a system-in-a-package module according to embodiments of the present invention.

FIG. 25 illustrates a method of forming a system-in-a-package module according to embodiments of the present invention. In act 2510, a printed circuit board or other substrate may be formed. Electrical components and contacts may be attached to the board in act 2520. A block may be inserted between contacts in act 2530. In act 2540, an overmold may be formed over the devices and over at least part of each of contacts. The block may be removed in act 2550. An interconnect structure, which may be flexible circuit board, may be attached in act 2560.

In other embodiments of the present invention, the contacts on the system-in-a-package module may have a height that exceeds a depth of the overmold or plastic encapsulation. This may leave a portion of the contacts above the overmold exposed where they may be connected to by an interconnect structure. This may be particularly useful where an underside of the interconnect structure may be used to support one or more devices. An example is shown in the following figure.

Figure 26:
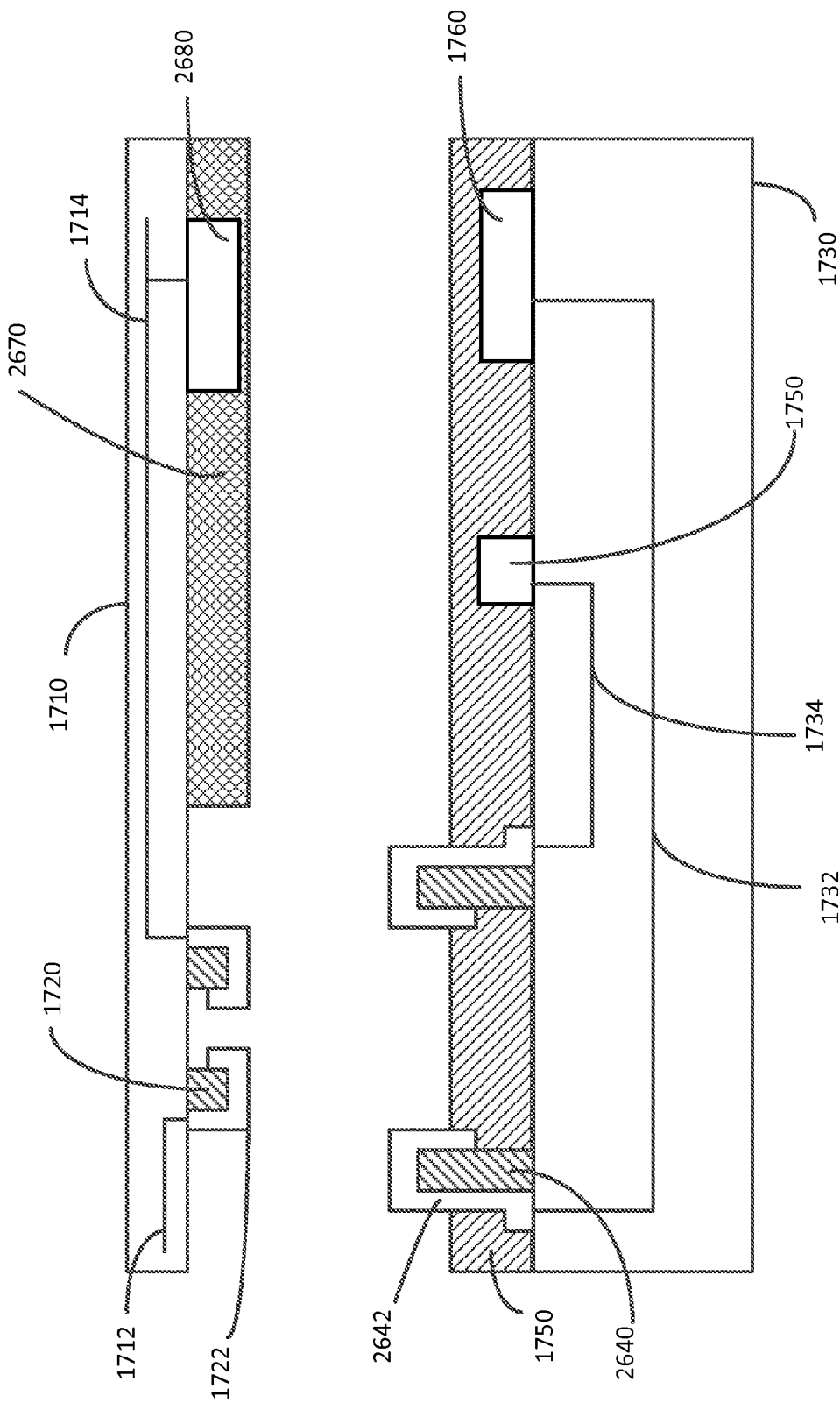
FIG. 26 illustrates a portion of an electronic device according to an embodiment of the present invention

FIG. 26 illustrates a portion of an electronic device according to an embodiment of the present invention. As before, board 1730 may support a number of traces 1732 and 1734. These traces 1732 and 1734 may connect to one or more electrical or mechanical components or circuits, shown here as components 1750 and 1760. In this example, contacts 2642 may have a height greater than a depth of overmold or plastic encapsulation 1750. This may leave an inside edge or other surface 2643 exposed where it may be contacted by contacts 2622. As before, an optional carrier 2640 may be used and either kept in place or removed after contacts 2642 are soldered or otherwise attached in place.

In this example, a second overmold 2670 may be formed on a bottom of interconnect structure 1710. One or more electrical or mechanical components or circuits 2680 may be encapsulated by overmold 2670. One or more traces, shown here as trace 1714, may electrically connect to components 2680. Again, interconnect structure 1710 may be mated to board 1730. An example is shown in the following figure.

Figure 27:
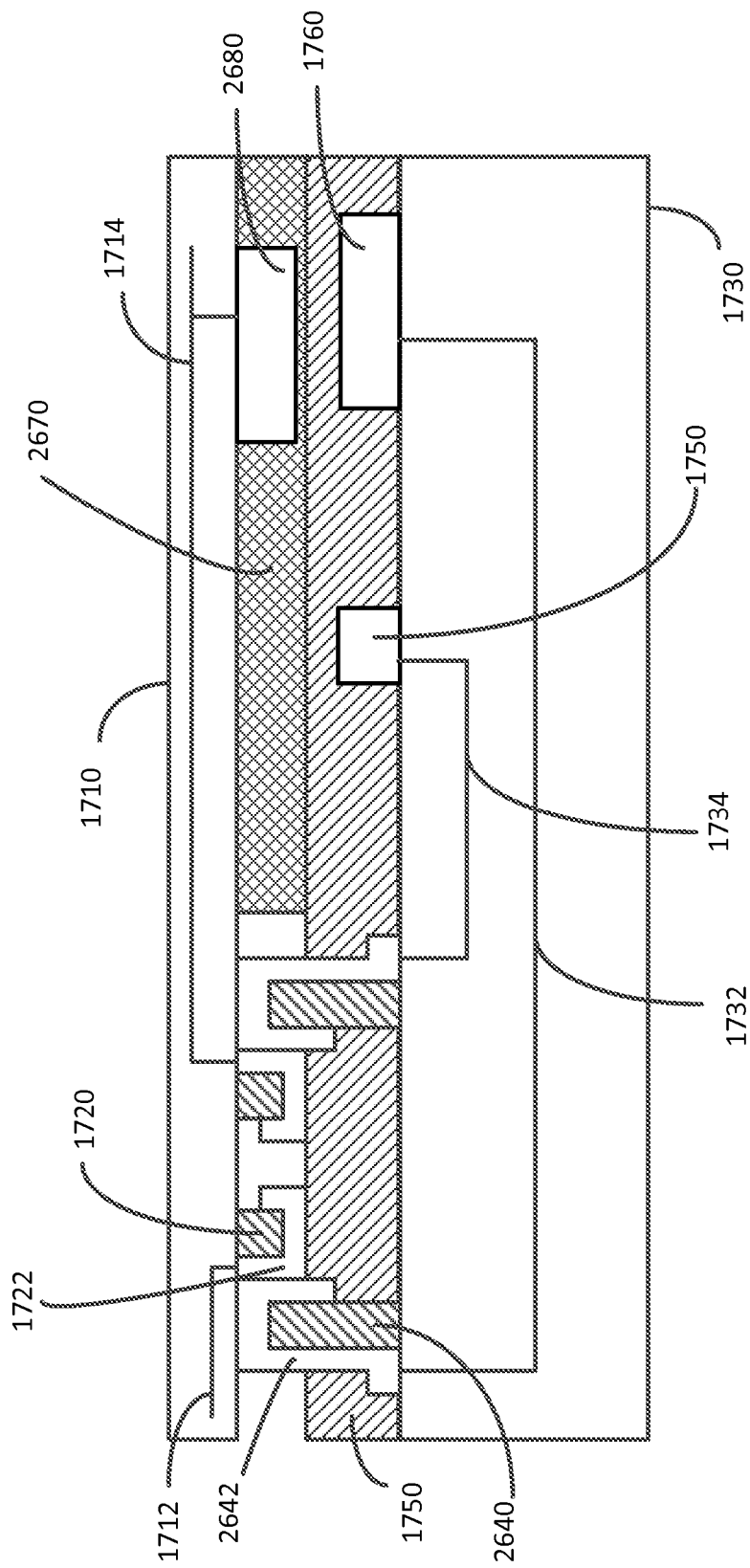
FIG. 27 illustrates a portion of an electronic device according to an embodiment of the present invention.

FIG. 27 illustrates a portion of an electronic device according to an embodiment of the present invention. In this example, contacts 1722 may mate with contacts 2642. This connection may provide a path from component 2680 through one or more traces 1712 or 1714, through contacts 1722 and contacts 2642, to components 1750 and 1760 via traces 1732 and 1734.

Figure 28:
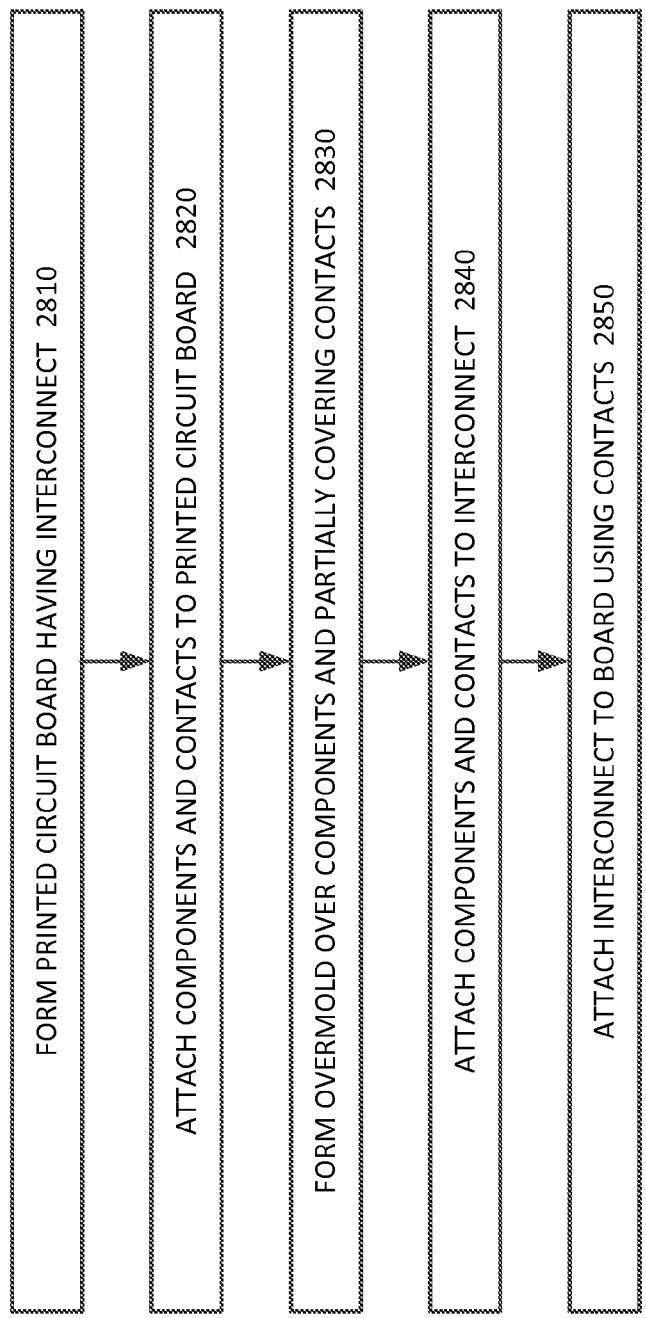
FIG. 28 illustrates a method of forming a system-in-a-package module according to an embodiment of the present invention.

FIG. 28 illustrates a method of forming a system-in-a-package module according to an embodiment of the present invention. In act 2810, a board may be received. Components and contacts may be attached in act 2820. An overmold covering the components and at least partially covering the contacts may be formed in acts 2830. An interconnect structure, which may include components and contacts, may be formed in act 2840. This interconnect structure may be attached to the board in act 2850.

It should be noted that while the interconnect structures such as the interposers and pins shown above, are well-suited to forming interconnect paths for system-in-a-package modules, in other embodiments of the present invention, other types of boards may be connected using these techniques. For example, other printed circuit boards that are not part of a system-in-a-package module may be electrically connected using these same or similar techniques and structures.

In various embodiments of the present invention, contacts, pins, interconnect paths, and other conductive portions of interposers, contacts, and pins, and other structures shown here may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide interconnect structures that may be located in and may connect to various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. In various embodiments of the present invention, these interconnect paths provided by these interposers and pins may be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
   a first board supporting a first plurality of traces;
   a plurality of electronic components attached to a top surface of the first board, the plurality of electronic components electrically connected to traces in the first plurality of traces;
   a first plurality of contacts attached to a top surface of the first board, the first plurality of contacts electrically connected to traces in the first plurality of traces, a first contact in the first plurality of contacts having a first inside edge surface directly facing a second inside edge surface of a second contact in the first plurality of contacts;
   a molded portion over the plurality of electronic components and a portion of each of the contacts in the first plurality of contacts, where a portion of an inside surface of each of the contacts in the first plurality of contacts is not covered by the molded portion; and
   an interconnect structure supporting a second plurality of traces and having a second plurality of contacts on a bottom surface, a third contact in the second plurality of contacts having a first outside edge surface directly facing away from a fourth contact in the second plurality of contacts, a second outside edge surface of the fourth contact directly facing away from the third contact, the first outside edge surface of the third contact to mate with the first inside edge surface of the first contact in the first plurality of contacts and the second outside edge surface of the fourth contact to mate with the second inside edge surface of the second contact in the first plurality of contacts.

2. The electronic device of claim 1 wherein an area of the molded portion between the first plurality of contacts on the top surface of the first board is removed to provide access to the first plurality of contacts.

3. The electronic device of claim 1 wherein the first plurality of contacts are soldered to the top surface of the first board without a supporting structure.

4. The electronic device of claim 1 wherein the first plurality of contacts has a first supporting structure associated with them to facilitate soldering the first plurality of contacts to the first board.

5. The electronic device of claim 1 wherein the electronic components comprise surface mount devices including an integrated circuit.

6. The electronic device of claim 1 wherein the first board is a printed circuit board and the interconnect structure is a flexible circuit board.

7. The electronic device of claim 6 wherein the first plurality of contacts are arranged in a non-symmetrical arrangement on the top surface of the first board.

8. An electronic device comprising:
a first board supporting a first plurality of traces;
a plurality of electronic components attached to a top surface of the first board, the plurality of electronic components electrically connected to traces in the first plurality of traces;
a first plurality of contacts attached to a top surface of the first board, the first plurality of contacts electrically connected to traces in the first plurality of traces, a first contact in the first plurality of contacts having a first inside edge surface facing a second inside edge surface of a second contact in the first plurality of contacts;
a molded portion over the plurality of electronic components and over a portion of an outside surface of each of the first and second contacts in the first plurality of contacts, where a portion of an inside surface of each of the first and second contacts in the first plurality of contacts is not covered by the molded portion; and
an interconnect structure supporting a second plurality of traces and having a second plurality of contacts on a bottom surface, the second plurality of contacts including a third contact and a fourth contact, the third contact having a first outside edge surface facing away from the fourth contact, a second outside edge surface of the fourth contact facing away from the third contact, the first outside edge surface of the third contact to mate with the first inside edge surface of the first contact in the first plurality of contacts and the second outside edge surface of the fourth contact to mate with the second inside edge surface of the second contact in the first plurality of contacts.

9. The electronic device of claim 8 wherein the first plurality of contacts have a height above the top surface of the first board that is greater than a height of the molded portion.

10. The electronic device of claim 8 wherein the electronic components comprise surface mount devices including an integrated circuit.

11. The electronic device of claim 8 wherein the first board is a printed circuit board and wherein the interconnect structure is a flexible circuit board.

12. The electronic device of claim 11 further comprising an interposer to form electrical connections between the traces in the first plurality of traces and a flexible circuit board.

13. An electronic device comprising:
a first board supporting a first plurality of traces;
a plurality of electronic components attached to a top surface of the first board, the plurality of electronic components electrically connected to traces in the first plurality of traces;
a first plurality of contacts attached to the top surface of the first board, the first plurality of contacts electrically connected to traces in the first plurality of traces, a first contact in the first plurality of contacts having a first inside edge surface facing a second inside edge surface of a second contact in the first plurality of contacts;
a molded portion over the plurality of electronic components and over a portion of an outside surface of each of the first and second contacts in the first plurality of contacts, where a portion of an inside surface of each of the first and second contacts in the first plurality of contacts is not covered by the molded portion;
an interposer comprising a printed circuit board including a plurality of layers and located on and attached to the top surface of the first board, the interposer having first contacts on a bottom surface electrically connected to traces in the plurality of traces of the first board, the interposer having a plurality of interconnect paths from the first contacts on the bottom surface to second contacts on a top surface, wherein the plurality of interposer interconnect paths are comprised of traces on the plurality of layers and vias electrically connecting traces on the plurality of layers; and
a second board having a second plurality of traces and having a second plurality of contacts on a bottom surface, the second plurality of contacts including a third contact and a fourth contact, the third contact having a first outside edge surface facing away from the fourth contact, a second outside edge surface of the fourth contact facing away from the third contact, the first outside edge surface of the third contact to mate with the first inside edge surface of the first contact in the first plurality of contacts and the second outside edge surface of the fourth contact to mate with the second inside edge surface of the second contact in the first plurality of contacts.

14. The electronic device of claim 13 wherein an area of the molded portion between the first plurality of contacts on the top surface of the first board is removed to provide access to the first plurality of contacts by the second plurality of contacts.

15. The electronic device of claim 13 wherein an area of the molded portion between the first plurality of contacts on the top surface of the first board is removed with a laser.

16. The electronic device of claim 13 wherein an area of the molded portion between the first plurality of contacts on the top surface of the first board is removed by etching.

17. The electronic device of claim 13 wherein the electronic components comprise surface mount devices including an integrated circuit.

18. The electronic device of claim 13 wherein the first board is a printed circuit board and the second board is a flexible circuit board.

* * * * *